(12) United States Patent
Yamamoto et al.

(10) Patent No.: US 10,196,472 B2
(45) Date of Patent: Feb. 5, 2019

(54) MOLDING MATERIAL FOR LIGHT-REFLECTING BODIES

(71) Applicant: Panasonic Intellectual Property Management Co., Ltd., Osaka (JP)

(72) Inventors: Hiroshi Yamamoto, Osaka (JP); Chihiro Takeuchi, Osaka (JP); Yusuke Uraoka, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 141 days.

(21) Appl. No.: 15/310,732

(22) PCT Filed: Jul. 30, 2015

(86) PCT No.: PCT/JP2015/003840
§ 371 (c)(1),
(2) Date: Nov. 11, 2016

(87) PCT Pub. No.: WO2016/021159
PCT Pub. Date: Feb. 11, 2016

(65) Prior Publication Data
US 2017/0081456 A1    Mar. 23, 2017

(30) Foreign Application Priority Data

Aug. 4, 2014 (JP) ................. 2014-158552
Aug. 7, 2014 (JP) ................. 2014-161551

(51) Int. Cl.
| | | |
|---|---|---|
| C08G 63/52 | (2006.01) |
| C08F 283/01 | (2006.01) |
| C08L 67/06 | (2006.01) |
| C08K 3/22 | (2006.01) |
| C08K 3/36 | (2006.01) |
| C08K 7/14 | (2006.01) |
| C08K 7/24 | (2006.01) |
| C08K 5/00 | (2006.01) |
| C08K 7/28 | (2006.01) |
| H01L 33/60 | (2010.01) |

(52) U.S. Cl.
CPC ............ *C08F 283/01* (2013.01); *C08G 63/52* (2013.01); *C08K 3/22* (2013.01); *C08K 3/36* (2013.01); *C08K 5/0025* (2013.01); *C08K 7/14* (2013.01); *C08K 7/24* (2013.01); *C08K 7/28* (2013.01); *C08L 67/06* (2013.01); *C08K 2003/2241* (2013.01); *C08K 2003/2296* (2013.01); *H01L 33/60* (2013.01); *H01L 2224/48091* (2013.01); *H01L 2224/48247* (2013.01); *H01L 2224/48257* (2013.01); *H01L 2224/97* (2013.01)

(58) Field of Classification Search
CPC ....... C08G 63/52; C08F 283/01; C08L 67/06; C08K 7/14
See application file for complete search history.

(56) References Cited

U.S. PATENT DOCUMENTS

2015/0138778 A1    5/2015 Oyama

FOREIGN PATENT DOCUMENTS

| JP | 5308601 B | 10/2013 |
| WO | 2013/183219 | 12/2013 |

OTHER PUBLICATIONS

International Search Report of PCT application No. PCT/JP2015/003840 dated Sep. 1, 2015.

*Primary Examiner* — Peter D. Mulcahy
(74) *Attorney, Agent, or Firm* — McDermott Will & Emery LLP

(57) ABSTRACT

A molding material for light-reflecting bodies contains unsaturated polyester, cross-linking agent, and filler. The unsaturated polyester contains at least one of first unsaturated polyester having a fumaric acid residue and a 1,6-hexanediol residue, and second unsaturated polyester having a fumaric acid residue, a 1,4-butanediol residue, and a trimethylolpropane residue.

17 Claims, 2 Drawing Sheets

MOLDING MATERIAL FOR LIGHT-REFLECTING BODIES

TECHNICAL FIELD

The present invention relates to molding materials for light-reflecting bodies suitable for fabricating light-reflecting bodies (reflectors).

BACKGROUND ART

Light-reflecting bodies (reflectors) are known to be used for reflecting light emitted from a light-emitting element, such as a light-emitting diode. One of known resin materials used for manufacturing light-reflecting bodies is unsaturated polyester resin. Unsaturated polyester resin includes unsaturated polyester (alkyd) and cross-linking agent, such as styrene. The use of unsaturated polyester resin, which is thermosetting resin, increases heat discoloration resistance of the light-reflecting body.

For example, PTL1 discloses fabrication of an LED reflector by molding unsaturated polyester resin composition containing unsaturated polyester resin and white pigment. This unsaturated polyester resin includes unsaturated polyester, co-polymerizable monomer or oligomer, and thermosetting resin. Still more, PTL1 refers to melt and heat molding methods, such as injection molding, injection compression molding, and transfer molding.

CITATION LIST

Patent Literature

PTL1: Japanese Patent Unexamined Publication No. 2014-019747

SUMMARY OF INVENTION

The present invention offers a molding material which has good fluidity, and can be used for fabricating light-reflecting bodies with high heat discoloration resistance when molded.

The molding material for light-reflecting bodies of the present invention includes unsaturated polyester, a cross-linking agent, and a filler. Unsaturated polyester includes at least one of first unsaturated polyester and second unsaturated polyester. The first unsaturated polyester contains a fumaric acid residue and a 1,6-hexanediol residue. The second unsaturated polyester contains a fumaric acid residue, a 1,4-butanediol residue, and a trimethylolpropane residue.

The molding material for light-reflecting bodies of the present invention has good fluidity. In addition, this molding material for light-reflecting bodies can be molded to fabricate light-reflecting bodies with high heat discoloration resistance.

DESCRIPTION OF EMBODIMENTS

Figure 1:
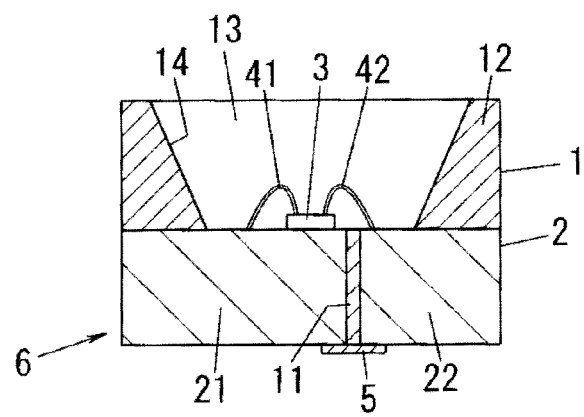
FIG. 1 is a sectional view of a lighting fixture having a light-reflecting body fabricated using a molding material for light-reflecting bodies in an embodiment of the present invention.

Prior to describing the embodiment of the present invention, a disadvantage of a conventional molding material for light-reflecting bodies is briefly described. When fabricating light-reflecting bodies by molding unsaturated polyester resin composition, mass production of light-reflecting bodies at low cost is expectable by adopting general transfer molding as a molding method of thermosetting resin composition. To achieve good moldability in transfer molding, higher fluidity is required for unsaturated polyester resin composition, compared to the case of, for example, adopting injection molding. Furthermore, the light-reflecting body is required to have high heat discoloration resistance in order to retain high light reflectivity over a long period of time.

However, unsaturated polyester resin composition having good fluidity suitable for transfer molding and also being capable of fabricating light-reflecting bodies with high heat discoloration resistance has not yet been achieved.

Transfer molding as well as injection molding are described as molding methods in PTL1. However, a molding method adopted in an exemplary embodiment of PTL1 only refers to injection molding. Accordingly, PTL1 does not practically disclose fabrication of light-reflecting bodies with high heat discoloration resistance, using unsaturated polyester resin and the transfer molding method.

First Exemplary Embodiment

A molding material for light-reflecting bodies (hereinafter referred to as "molding material") in the present exemplary embodiment is used for manufacturing light-reflecting bodies. This molding material includes unsaturated polyester, a cross-linking agent, and a filler.

In the present exemplary embodiment, unsaturated polyester contains a compound (hereinafter referred to as "first unsaturated polyester") containing a fumaric acid residue and a 1,6-hexanediol residue.

The first unsaturated polyester is, for example, synthesized by dehydration condensation of raw material monomer containing fumaric acid and 1,6-hexanediol.

Since the first unsaturated polyester has the above composition, viscosity of the first unsaturated polyester when melted is low. The fluidity of the molding material containing the first unsaturated polyester is thus high during molding. Accordingly, moldability improves on molding the molding material, using the transfer molding method. In addition, the above composition of the first unsaturated polyester achieves high crystallinity, in addition to a melting point suitable for transfer molding. Furthermore, high reactivity of the first unsaturated polyester leaves less unreacted components in a molded body obtained by thermally curing the molding material. This improves the heat discoloration resistance of light-reflecting body 1 fabricated by the molding material. Accordingly, the light-reflecting body can retain high light reflectivity over a long period of time.

The first unsaturated polyester further preferably contains at least one residue selected from the group consisting of a neopentyl glycol residue, a trimethylolpropane residue, and a cyclohexane 1,4-dimethanol residue. In this case, viscosity of the first unsaturated polyester is lowered when melted, and also further improves heat discoloration resistance of the light-reflecting body fabricated from this molding material.

The first unsaturated polyester preferably has crystallinity. In other words, the first unsaturated polyester is preferably crystalline unsaturated polyester. The crystalline first unsaturated polyester improves storage stability of the molding material. More specifically, the molding material shows high stability under temperatures not greater than a melting point of the first unsaturated polyester. In addition, higher fluidity of the molding material on molding achieves good moldability. Furthermore, the crystalline first unsaturated polyester can increase the light reflectance of the light-reflecting body and also improve sustainability of high reflectivity.

In the exemplary embodiment, crystalline unsaturated polyester has a melting point lower than ordinary temperatures. It is solid under ordinary temperatures, and a low-viscous liquid at the melting point or above. Crystallinity of the first unsaturated polyester can be confirmed, for example, by white turbidity generated on cooling to a room temperature at a rate of −10° C./min after heating and melting the first unsaturated polyester. Crystallinity can also be confirmed by its polarization characteristic observed using a polarizing microscope when the first unsaturated polymer is cooled to a room temperature at a rate of −10° C./min after heating and melting the first unsaturated polyester. Crystallinity is confirmed typically using a cooling and heating stage for microscope by Linkam.

A glass transition temperature of the first unsaturated polyester is preferably in a range from 30° C. to 50° C., inclusive. A melting point of the first unsaturated polyester is preferably in a range from 70° C. to 100° C., inclusive.

Storage stability of molding material particularly increases when a glass transition temperature of the first unsaturated polyester is 30° C. or above. In other words, when the molding material is granulated and stored, fusion of granules of the molding material at high temperatures, such as in summer, is suppressed. When a glass transition temperature is higher than 50° C., a melting point of the first saturated polyester may also become too high, which is not preferable. The glass transition temperature of the first unsaturated polyester is easily adjustable by adjusting a composition ratio or molecular weight of components.

When the melting point of the first unsaturated polyester is 100° C. or below, the first unsaturated polyester can be easily melted without proceeding hardening reaction on heating and kneading the molding material for preparation. This enables to easily prepare the molding material that does not contain cured product. In addition, reduction of the light reflectance of light-reflecting body is suppressed when the melting point of the first unsaturated polyester is 70° C. or above. The reason is considered as below.

When the melting point of the first unsaturated polyester is low, the first unsaturated polyester melts by heat generated from a grinder or by friction heat on pulverizing the molding material with a grinder, resulting in a partially-melted molding material. When this partially-melted molding material collides with metal components, such as a rotary blade of the grinder, the molding material tends to rub against the metal component in a contact state. Rubbing of hard components, such as white pigment and inorganic filler, of the molding material against metal components tends to cause mixing of metal powder generated from the metal component, with the molding material. This metal powder is considered to cause reduction of the light reflectance of the light-reflecting body. In contrast, when the melting point of the first unsaturated polyester is 70° C. or above, the first unsaturated polyester unlikely melts on pulverizing the molding material with the grinder. Accordingly, the molding material is easily and immediately pulverized on colliding with metal components, such as a rotary blade. Rubbing of the molding material against metal components thus unlikely occurs. As a result, metal powder is unlikely mixed in the molding material, and reduction of the light reflectance of the light-reflecting body is thus suppressed.

Furthermore, when the melting point of the first unsaturated polyester is in a range from 70° C. to 100° C., inclusive, the molding material can have particularly good fluidity on molding the molding material. Accordingly, moldability improves even if transfer molding is adopted for molding the molding material.

Note that the melting point of the first unsaturated polyester is a temperature at the peak heat of fusion measured using a differential scanning calorimeter (DSC) while the temperature of the first unsaturated polyester is raised.

The iodine number of the first unsaturated polyester is preferably in a range from 70 to 120, inclusive. The iodine number not less than 70 achieves particularly high glass transition temperatures of the light-reflecting body. On the other hand, the iodine number not greater than 120 lowers reactivity of the light-reflecting body and also particularly increases the strength of the light-reflecting body. The iodine number is more preferably in a range from 80 to 110, inclusive.

Furthermore, the iodine number of the first unsaturated polyester is also preferably in a range from 120 to 135, inclusive. In this case, hardness of the material can be enhanced while retaining crystallinity. This reduces unreacted components and improves durability.

The iodine number of the first unsaturated polyester is easily adjustable by adjusting, for example, the percentage of fumaric acid residue in the first unsaturated polyester.

The ICI viscosity (high shear viscosity) of the first unsaturated polyester at 150° C. is preferably in a range from 0.1 Pa·s to 5 Pa·s, inclusive, and more preferably from 0.5 Pa·s to 3 Pa·s, inclusive. In this case, the molding material has appropriate fluidity on molding. This achieves particularly good moldability and also effectively suppresses generation of burrs. The ICI viscosity of the first unsaturated polyester is easily adjustable by adjusting the composition of the first unsaturated polyester as required.

A structure of the first unsaturated polyester is further detailed. The first unsaturated polyester has polybasic acid residue and polyol residue, and the polybasic acid residue includes unsaturated polybasic acid residue.

In the first unsaturated polyester, a molar ratio of polyol residue to polybasic acid residue is, for example, between 1.1 and 1.3. In other words, the first unsaturated polyester is synthesized by dehydration condensation of polybasic acids including unsaturated polybasic acids and polyols at the molar ratio between 1:1.1 and 1:1.3.

In the exemplary embodiment, the unsaturated polybasic acid residue contains fumaric acid residue. This reduces remaining unreacted components when the molding material is thermally cured, and thus heat discoloration resistance of the light-reflecting body particularly improves.

The percentage of fumaric acid residue with respect to the total polybasic acid residue in the first unsaturated polyester is preferably in a range from 90 mol % to 100 mol %, inclusive. In this case, the percentage of fumaric acid residue not including aromatic ring in the first unsaturated polyester is high, and thus heat discoloration resistance of the light-reflecting body particularly increases.

The unsaturated polybasic acid residue in the first unsaturated polyester preferably contain only fumaric acid residue. However, fumaric acid residue and other radical may be included. For example, unsaturated polybasic acid residue may include one or more residues selected from the group consisting of maleic acid residue, citraconic acid residue, mesaconic acid residue, itaconic acid residue, tetrahydrophthalic acid residue, methyltetrahydrophthalic acid residue, and glutaconic acid residue, in addition to fumaric acid residue.

The percentage of unsaturated polybasic acid residue with respect to the total polybasic acid residue is preferably in a range from 90 mol % to 100 mol %, inclusive. The polybasic acid residue may contain unsaturated polybasic acid residue and saturated polybasic acid residue. The saturated polybasic acid residue can contain one or more residues selected from the group consisting of phthalic acid residue, 1,4-cyclohexanedicarboxylic acid residue, isophthalic acid residue, terephthalic acid residue, succinic acid residue, adipic acid residue, sebacic acid residue, azelaic acid residue, endo-methylenetetrahydrophthalic acid residue, HET acid residue, and tetrabromophthalic acid residue. In this case, heat discoloration resistance of the light-reflecting body particularly increases.

As described above, the polyol residue contains 1,6-hexanediol residue. The percentage of 1,6-hexanediol residue with respect to the total polyol residue in the first unsaturated polyester is preferably 80 mol % or greater. It may also be 100 mol %. If the percentage of 1,6-hexanediol residue is 80 mol % or greater, crystallization of cured product on curing the molding material is accelerated, and thus dimensional stability of the light-reflecting body increases.

The first unsaturated polyester may include at least one residue selected from the group consisting of neopentyl glycol residue, trimethylolpropane residue, and cyclohexane 1,4-dimethanol residue. In this case, the percentage of the total of neopentyl glycol residue, trimethylolpropane residue, and cyclohexane 1,4-dimethanol residue with respect to the total polyol residue in the first unsaturated polyester is preferably in a range from 1 mol % to 20 mol %, inclusive, and more preferably from 5 mol % to 20 mol %, inclusive. If this percentage is not less than 1 mol % and not less than 5 mol %, in particular, light resistance of the light-reflecting body improves. In other words, reduction of light reflectivity of the light-reflecting body is suppressed when light, such as ultraviolet rays, is irradiated to the light-reflecting body. Furthermore, if this percentage is not greater than 20 mol %, crystallization on curing the molding material is accelerated, in addition to ensuring the high light resistance of the light-reflecting body.

The percentage of neopentyl glycol residue with respect to the total polyol residue in the first unsaturated polyester is preferably in a range from 0 mol % to 20 mol %, inclusive. In this case, crystallization of cured product is accelerated on curing the molding material, in addition to improving the light resistance of the light-reflecting body. In other words, higher the percentage of neopentyl glycol residue is, better the light resistance of the light-reflecting body. On the other hand, in order to sufficiently accelerate crystallization of cured product on curing the molding material, the percentage of neopentyl glycol residue is preferably not greater than 20 mol %.

The percentage of trimethylolpropane residue with respect to the total polyol residue in the first unsaturated polyester is preferably in a range from 0 mol % to 15 mol %, inclusive. In this case, characteristics, such as uniformity, of the light-reflecting body improve by improving compatibility of the first unsaturated polyester and the cross-linking agent in the molding material. This is assumed to be achieved by appropriate lowering of crystallinity of the first unsaturated polyester by trimethylolpropane residue.

The percentage of cyclohexane 1,4-dimethanol residue with respect to the total polyol residue in the first unsaturated polyester is preferably in a range from 0 mol % to 20 mol % inclusive In this case, crystallization of cured product on curing the molding material is accelerated, in addition to higher light resistance of the light-reflecting body.

The polyol residue may further include a residue other than 1,6-hexanediol residue, neopentyl glycol residue, trimethylolpropane residue, and cyclohexane 1,4-dimethanol residue. For example, polyol residue can include at least one residue selected from the group consisting of ethylene glycol residue, 1,3-propanediol residue, 1,4-butanediol residue, 1,3-butanediol residue, 1,5-pentanediol residue, propylene glycol residue, diethylene glycol residue, triethylene glycol residue, dipropylene glycol residue, hydrogenated bisphenol A residue, bisphenol A propylene oxide compound residue, and dibromoneopentyl glycol residue.

The polyol residue also preferably includes one or more residues selected from the group consisting of ethylene glycol residue, 1,3-propanediol residue, 1,4-butanediol residue, 1,5-pentanediol residue, and cyclohexane dimethanol residue. In this case, heat discoloration resistance of the light-reflecting body particularly improves.

The acid number of the first unsaturated polyester is preferably in a range from 15 mg-KOH/g to 35 mg-KOH/g, inclusive, and more preferably in a range from 20 mg-KOH/g to 30 mg-KOH/g, inclusive.

The first unsaturated polyester is synthesized, for example, by dehydration condensation of raw material monomer containing polybasic acids, including unsaturated polybasic acids, and polyols. In this case, the first unsaturated polyester includes polybasic acid residue derived from polybasic acids and polyol residue derived from polyols. In this raw material monomer, polybasic acids contain fumaric acid, and polyol contains 1,6-hexanediol.

In the exemplary embodiment, reactivity of the first unsaturated polyester at ordinary temperatures is low. Therefore, storage stability of the molding material containing the first unsaturated polyester is high.

In addition, the molding material in the exemplary embodiment includes the first unsaturated polyester, and thus adhesion between cured product of the molding material and metal is high. Accordingly, adhesion of the light-reflecting body and a metal lead becomes high when the metal lead is embedded in the light-reflecting body fabricated from this molding material.

The unsaturated polyester in the molding material preferably contains, in particular, only the first unsaturated polyester. Still more, the unsaturated polyester may contain the first unsaturated polyester and also unsaturated polyester that does not have one or more residues of fumaric acid residue and 1,6-hexanediol residue. However, the percentage of the first unsaturated polyester with respect to the total unsaturated polyester is preferably 40% by mass or greater, and is more preferably 95% by mass or greater.

The cross-linking agent is a component that establishes a cross-linked structure between unsaturated polyester chains by reacting with molecules of unsaturated polyester. For example, the cross-linking agent can contain one or more compounds selected from the group consisting of vinyl, methacrylate, and acrylate polymerizable monomers, and prepolymers formed by polymerizing one or more compounds of these polymerizable monomers. Examples of the vinyl polymerizable monomer include styrene, vinyl toluene, divinyl benzene, α-methylstyrene, methyl methacrylate, and vinyl acetate. Examples of the methacrylate and acrylate polymerizable monomers include diallylphthalate, isodiallylphthalate, triallylcyanurate, diallyltetrabromophthalate, phenoxyethylacrylate, 2-hydroxyethylacrylate, and 1,6-hexanedioldiacrylate.

In particular, the cross-linking agent preferably contains a compound that has a boiling point of 150° C. or above. In this case, volatilization of the cross-linking agent from the molding material is suppressed. Accordingly, generation of odor from the molding material is suppressed, and thus the work environment is improved. In addition, stability of composition of the molding material increases. Still more, a difference between the melting point of the first unsaturated polyester and a softening point of the cross-linking agent becomes small, and thus highly-uniform molding material can be easily achieved by heating and kneading. Furthermore, a glass-transition point of the light-reflecting body becomes higher, and thus heat discoloration resistance of the light-reflecting body increases.

As a compound having a boiling point of 150° C. or above, the cross-linking agent preferably, in particular, contains one or more compounds selected from the group consisting of diallylphthalate, isodiallylphthalate, diethyleneglycoldiacrylate, and polymer of these compounds. Here, the polymer is of one or more compounds selected from the group consisting of diallylphthalate, isodiallylphthalate, and diethyleneglycolacrylate. Compounds having a boiling point of 150° C. or above include compounds that do not boil at ordinary pressure and have heat decomposition temperature of 150° C. or above.

The cross-linking agent preferably contains at least one of diallylphthalate monomer and triallylcyanurate. In this case, stain on molds can be suppressed when molding methods, such as transfer molding, are adopted for molding, in addition to obtaining the effect due to high volatilization temperature.

The percentage of the cross-linking agent with respect to the total amount of the unsaturated polyester and the cross-linking agent is preferably, in particular, in a range from 2 mass % to 15 mass %, inclusive. The glass transition point of the light-reflecting body particularly increases when this percentage is 2 mass % or greater. When this percentage is not greater than mass %, heat discoloration resistance of the light-reflecting body becomes particularly high.

The molding material may contain curing catalyst. In this case, the reaction of the unsaturated polyester and the cross-linking agent is accelerated to efficiently construct a cross-linked structure. This improves the moldability of the molding material and the shape stability of the light-reflecting body. The curing catalyst can contain, for example, one or more compounds selected from the group consisting of curing accelerators and polymerization initiators.

The polymerization initiator can contain, for example, thermal decomposition type organic peroxide. The organic peroxide can contain, for example, one or more compounds selected from the group consisting of t-butyl peroxy-2-ethylhexyl monocarbonate, 1,1-di(t-hexylperoxyl) cyclohexane, 1,1-di(t-butylperoxyl)-3,3,5-trymethylcyclohexane, t-butylperoxyl octoate, benzoilperoxide, methylethylketone peroxide, acetylacetone peroxide, t-butyl peroxylbenzoate, and dicumyl peroxide.

The polymerization initiator preferably contains, in particular, organic peroxide whose ten hour half-life temperature is 100° C. or above. More specifically, the polymerization initiator preferably contains dicumyl peroxide. If the polymerization initiator contains this kind of organic peroxide, reduction with time of the light reflectance of the light-reflecting body is further suppressed.

The percentage of organic peroxide with respect to the total amount of the unsaturated polyester and the cross-linking agent in the molding material is preferably in a range from 1 mass % to 3 mass %, inclusive. A curing reaction of the molding material can be effectively accelerated if this percentage is 1 mass % or above. In addition, if this percentage is 3 mass % or less, excessive shortening of the molding time can be suppressed. This can suppress occurrence of defects, such as thinning or scrape, on the light-reflecting body.

The molding material may contain polymerization inhibitor. The polymerization inhibitor can contain, for example, one or more compounds selected from the group consisting of quinone compounds and phenolic compounds. Examples of the quinone compound include hydroquinone, monomethyl etherhydroquinone, toluhydroquinone, di-t-4-methylphenol, monomethylether hydroquinone, phenothiazine, t-butylcatechol, parabenzoquinone, and pyrogallol. Examples of the phenolic compound include 2,6-di-t-butyl-p-cresol, 2,2-methylene-bis-(4-methyl-6-t-butylphenol), and 1,1,3-tris-(2-methyl-4-hydroxyl-5-t-butylphenyl).

The molding material may only contain unsaturated polyester resin as thermosetting resin. However, it may further contain other thermosetting resin, such as epoxy resin. However, the percentage of the unsaturated polyester resin with respect to the total thermosetting resin is preferably 50% by mass or greater.

A filler preferably includes, in particular, white pigment. The white pigment gives light reflectivity to the light-reflecting body formed of the molding material. The white pigment can contain one or more materials selected from the group consisting of titanic oxide, barium titanate, strontium titanate, aluminum oxide, magnesium oxide, zinc oxide, zinc sulfide, barium sulfate, magnesium carbonate, and barium carbonate.

In particular, the white pigment preferably contains one or more materials selected from the group consisting of titanic oxide, barium titanate, barium sulfate, zinc oxide, and zinc sulfide. Zinc oxide is preferably included in the white pigment because heat conductivity of the light-reflecting body particularly increases. Aluminum oxide that has high heat conductivity is also preferably to be included in the white pigment.

When the white pigment contains titanic oxide, titanic oxide can contain one or more materials selected from, for example, anatase-type titanium oxide, rutile-type titanium oxide, and brucite-type titanium oxide. In particular, rutile-type titanium oxide has good heat stability, and thus titanic oxide preferably contains rutile-type titanic oxide.

The surface of the white pigment may be treated with fatty acids, coupling agent, or the like. In this case, agglomeration and oil absorption of the white pigment are suppressed, and filling capability of the white pigment in the molding material increases.

The average particle size of the white pigment is preferably 2.0 μm or smaller. This average particle size is also preferably 0.01 μm or greater. Still more, this average particle size is preferably in a range from 0.03 to 1.0 μm, more preferably from 0.1 to 0.7 μm, and furthermore preferably from 0.2 to 0.5 μm. The average particle size of the white pigment is measured using the laser diffraction scattering method.

The percentage of the white pigment in the molding material is preferably in a range from 15% by mass to 40% by mass, inclusive. In this case, the heat discoloration resistance of the light-reflecting body particularly increases, and the light reflectivity of the light-reflecting body also particularly increases.

The filler may further contain inorganic filler other than the white pigment. In this case, the light reflectivity of the light-reflecting body can be further increased and the shape stability of the light-reflecting body can be further increased by selecting an appropriate material. In addition, the inorganic filler can increase heat conductivity of the light-reflecting body by selecting an appropriate material for the inorganic filler. Accordingly, discoloration, deterioration, etc. of the light-reflecting body by heat can be further suppressed.

The inorganic filler can contain, for example, one or more materials selected from the group consisting of silica, calcium carbonate, calcium hydroxide, aluminum hydroxide, and mica.

In particular, the inorganic filler preferably contains silica. In this case, the light reflectivity of the light-reflecting body further increases, and the shape stability of the light-reflecting body also further increase. Silica can contain, for example, one or more materials selected from molten silica powder, spherical silica powder, crushed silica powder, and crystalline silica powder. In particular, silica preferably contains molten silica.

The inorganic filler also preferably contains a thermally-conductive inorganic filler. In this case, the heat conductivity of the light-reflecting body further increases, and thus discoloration, deterioration, etc. of the light-reflecting body due to heat are further suppressed. The thermally-conductive inorganic filler can contain, for example, one or more materials selected from the group consisting of crystalline silica, alumina, silicon nitride, boron nitride, and aluminum nitride.

The thermally-conductive inorganic filler preferably contains a metal-containing filler, and preferably contains, in particular, an aluminum-containing filler. The aluminum-containing filler can contain, for example, aluminum hydroxide.

The surface of inorganic filler may be treated with fatty acids, coupling agent or the like. In this case, agglomeration and oil absorption of inorganic filler are suppressed, and filling capability of the inorganic filler in the molding material increases.

The inorganic filler also preferably contains hollow particles. For example, the hollow particles can contain hollow glass particles, hollow silica particles, or both of them.

The percentage of the hollow particles in the molding material is preferably in a range from 5% by mass to 15% by mass, inclusive. Ultraviolet ray resistance of the light-reflecting body particularly improves when the percentage of the hollow particles is 5% by mass or greater. In addition, an increase of viscosity of molding material during molding can be suppressed when the percentage of the hollow particles is 15% by mass or smaller.

The hollow particles are preferably surface-treated by one or more materials selected from the group consisting of calcium carbonate, zinc oxide, and talc. More specifically, the hollow particles are preferably coated with one or more materials selected from the group consisting of calcium carbonate, zinc oxide, and talc. In this case, whiteness of the light-reflecting body improves, and the ultraviolet ray resistance of the light-reflecting body also improves. One of probable reasons for improvements is a higher dispersibility of the hollow particles in the molding material as well as inside the light-reflecting body by surface treatment of the hollow particles.

A preferable specific example of the hollow particles is No. S60-HS (hollow glass beads) produced by 3M Japan Limited.

The average particle size of the inorganic filler is preferably 100 μm or smaller. In this case, moldability of the molding material becomes particularly good, and heat discoloration resistance and moisture resistance of the light-reflecting body also become high. Furthermore, this average particle size is preferably 0.1 μm or greater. In this case, handling of the molding material improves. The average particle size of the inorganic filler is preferably not greater than 80 μm, and more preferably not greater than 50 μm. Still more, the average particle size of inorganic filler is further preferably not less than 0.3 μm. Furthermore, injection moldability of the molding material becomes particularly good when the average particle size of the inorganic filler is in a range from 8 to 20 μm. The average size of the inorganic filler is measured using the laser diffraction scattering method.

The percentage of the inorganic filler with respect to the total thermosetting resin in the molding material is preferably 40% by mass or greater. In this case, the shape stability of the light-reflecting body particularly increases. Still more, this percentage of the inorganic filler is preferably 300% by mass or smaller. In this case, the moldability of the molding material particularly increases. In particular, the percentage of the inorganic filler is preferably in a range from 50% by mass to 250% by mass, inclusive.

The percentage of the white pigment with respect to the total filler is preferably 30% by mass or greater. In this case, the light reflectivity of the light-reflecting body particularly increases. This percentage is preferably 95% by mass or smaller. This percentage is more preferably in a range from 35% by mass to 90% by mass, inclusive, and more preferably from 40% by mass to 85% by mass, inclusive.

The percentage of the filler with respect to the total thermosetting resin in the molding material is preferably 500% by mass or smaller. In this case, the fluidity of the molding material during molding becomes particularly high. This percentage of the filler is preferably 100% by mass or greater. In this case, the light reflectivity of the light-reflecting body particularly increases. This percentage of the filler is more preferably in a range from 100% by mass to 400% by mass, inclusive, and furthermore preferably from 200% by mass to 300% by mass, inclusive.

The filler may also either contain or not contain a fibrous filler.

When the filler does not contain the fibrous filler, the fluidity of the molding material during molding becomes extremely high. In this case, good moldability is achievable even if a mold array package (MAP) method is adopted for molding the molding material. The MAP method is a processing method of integrally molding a single molded body first, and then cutting this molded body to fabricate multiple products each having a predetermined size.

On the other hand, when the filler contains the fibrous filler, the curing shrinkage of the molding material on molding is suppressed, and the hardness of the light-reflecting body also increases. This further increases dimensional stability of the light-reflecting body.

The percentage of the fibrous filler with respect to the total thermosetting resin in the molding material is preferably in a range from 10% by mass to 200% by mass, inclusive. In this case, the curing shrinkage of the molding material during molding is particularly suppressed, and the strength of the light-reflecting body also particularly increases. This percentage of the fibrous filler is more preferably in a range from 20% by mass to 100% by mass, inclusive, and furthermore preferably from 30% by mass to 80% by mass, inclusive.

Even if the filler contains the fibrous filler, the fluidity of the molding material during molding becomes extremely high as long as an amount of the filler and an amount of the fibrous filler in the molding material are appropriately set. The molding material can be molded with good moldability even if the MAP method is adopted. In this case, the percentage of the filler with respect to the total molding material is preferably in a range from 70% by mass to 90% by mass, inclusive, and in particular, more preferably from 75% by mass to 85% by mass, inclusive. The percentage of the fibrous filler with respect to the total molding material is preferably in a range from 2% by mass to 10% by mass, inclusive.

The fibrous filler can contain fibrous fillers used in FRP (fiber reinforced plastics), such as BMC (bulk molding compound) and SMC (sheet molding compound).

The average fiber diameter of the fibrous filler is preferably in a range from 6 to 12 μm, and more preferably from 6 to 8 μm. In this case, the strength of the light-reflecting body particularly increases. In addition, the average fiber length of the fibrous filler is preferably in a range from 100 to 300 μm, and more preferably from 150 to 250 μm. In this case, the strength of the light-reflecting body particularly improves, and its light reflectance also particularly improves. The average fiber diameter and the average fiber length of the fibrous filler are arithmetic means of fiber diameters and fiber lengths obtained by processing images of the fibers in the fibrous filler captured by an electron microscope.

The fibrous filler can contain one or more materials selected from, for example, glass fiber, vinylon fiber, aramid fiber, polyester fiber, wollastonite, potassium titanate whisker, whisker of carbonate such as calcium carbonate, and hydrotalcite. In particular, the fibrous filler preferably contains glass fiber.

For example, glass fiber can contain one or more materials selected from the group consisting of glass fibers including E-glass (Alkali-free glass for electricity), C glass (alkali glass for chemical), A-glass (glass for acid resistance), and S-glass (highly stiff glass) made from silicate glass and borosilicate glass. The glass fiber may be either long fiber (roving) or short fiber (chopped strand). The surface of glass fiber may also be treated. In particular, the glass fiber preferably contains chopped strands cut to a length in a range from 3 to 6 mm after converging E-glass fibers with fiber diameter in a range from 10 to 15 μm using a convergence agent, such as vinyl acetate, and then applying surface treatment using silane coupling agent.

In particular, the average fiber diameter of glass fiber is preferably in a range from 6 to 12 μm, and more preferably from 6 to 8 μm. In this case, the strength of the light-reflecting body particularly increases.

The average fiber length of glass fiber is preferably in a range from 100 to 300 μm, and more preferably from 150 to 250 μm. In this case, the strength of light-reflecting body 1 particularly improves, and its light reflectance also particularly improves. When the average fiber length is 100 μm or less, the light reflectance of the light-reflecting body may reduce due to rubbing between glass fiber and metal during kneading or injection molding. The average fiber diameter and the average fiber length of the fiber are arithmetic means of fiber diameters and fiber lengths obtained by processing images of fibers captured by an electron microscope.

The average fiber length of glass fiber before being blended into the molding material does not needed to be in a range from 100 to 300 μm, as long as the average fiber length of glass fiber in the molding material and the light-reflecting body is in a range from 100 to 300 μm. For example, glass fibers with length of about 3 mm may be used, and then the average fiber length in the molding material becomes within a range from 100 to 300 μm as a result of stress applied to the glass fibers typically by kneading in the course of preparation of the molding material.

A further specific example of glass fiber is chopped strand with diameter of 13 μm and length from 3 to 5 μm, chopped strand with diameter of 6 μm and length from 3 to 5 μm, and milled fiber with diameter from 6 to 13 μm and average fiber length from 250 to 600 μm.

The maximum fiber length of glass fiber is also preferably not greater than 300 μm. In this case, an insufficient filling defect is further suppressed by less clogging of the molding material typically at the gate on molding the molding material using molding methods, such as transfer molding. In particular, a gate diameter is small when fabricating a small light-reflecting body for reflecting light of light-emitting element, such as light-emitting diode, but clogging of molding material at such gate can also be suppressed.

Furthermore, a cross section of the glass fiber preferably has an irregular shape. The irregular shape is a shape other than a round shape. For example, the irregular shape is a shape whose aspect ratio is greater than 1, such as cocoon and oval shapes. The aspect ratio of cross section is preferably 1.5 or greater. The glass fiber satisfying this aspect ratio includes chopped strand with irregularly-shaped cross section by Nitto Boseki Co., Ltd. When the glass fiber having this irregularly-shaped cross section is used, the strength of light-reflecting body improves. In addition, warpage of the light-reflecting body is suppressed. This improves flatness of the light-reflecting body, and thus its light reflectance further improves.

The fibrous filler is also preferably treated with an aliphatic urethane convergence agent. In this case, the fibers of the filler are bundled by the aliphatic urethane convergence agent, and adhesion of resin and fibrous filler in the molding material and the light-reflecting body also increases. This improves dispersibility of the fibrous filler in the molding material and the light-reflecting body. Accordingly, the fibrous filler can effectively improve a mechanical strength of the light-reflecting body, and hardly obstruct the light reflectivity of the light-reflecting body. As a result, the high strength and the high light reflectivity of the light-reflecting body are secured. Still more, the aliphatic urethane convergence agent hardly turns yellow because it has smaller parts that cause to turn yellow, such as an unsaturated group. Accordingly, the light reflectivity of the light-reflecting body unlikely reduces with time.

The fibrous filler is preferably first treated with an amino silane coupling agent, and then with an aliphatic urethane convergence agent. In this case, adhesion of the aliphatic urethane convergence agent to the fibrous filler increases.

For example, the amino silane coupling agent can contain one or more compounds selected from the group consisting of γ-aminopropyl toriethoxy silane, N-β-(aminoethyl)-γ-aminopropyl trimethoxy silane, N-β-(aminoethyl)-N'-β-(aminoethyl)-γ-aminopropyl trimethoxy silane, and γ-anilinopropyl trimethoxy silane. The percentage of the amino silane coupling agent is preferably not greater than 0.3% by mass with respect to the fibrous filler, and more preferably not greater than 0.2% by mass.

The aliphatic urethane convergence agent can include an isocyanate residue and a polyol residue. The aliphatic urethane convergence agent can be obtained by causing reaction between an isocyanate compound that induces the isocyanate residue and a polyol compound that induces the polyol residue. These compounds may be reacted together with an additive selected from chain extenders and cross-linking agents, as required.

In particular, the isocyanate residue in the aliphatic urethane convergence agent preferably contains one or more residues selected from the group consisting of isophorone diisocyanate residue, hexamethylene diisocyanate residue, methylenebis (4,1-cyclohexylene) diisocyanate residue, 1,3-bis (isocyanatemethyl) cyclohexane residue, norbornane diisocyanate residue, and meta-xylylenediisocyanate residue. In addition, the polyol residue in the aliphatic urethane convergence agent preferably contains one or more residues selected from the group consisting of polycaprolactonepolyol, polybutadienepolyol, and polycarbonatepolyol. In this case, turning yellow of the aliphatic urethane convergence agent is particularly suppressed. Accordingly, the turning yellow and the degradation in the light reflectance of the light-reflecting body by light and heat are particularly suppressed.

The aliphatic urethane convergence agent preferably includes a polyesterpolyol residue and at least one of an aliphatic diisocyanate residue and an alicyclic diisocyanate residue. The polyesterpolyol residue preferably includes an aliphatic polyhydric alcohol residue and at least one of an aliphatic polybasic acid residue and an alicyclic polybasic acid residue. In this case, turning yellow of the aliphatic urethane convergence agent is particularly suppressed. Accordingly, turning yellow and the degradation in the light reflectance of the light-reflecting body by light and heat are particularly suppressed.

The aliphatic urethane convergence agent also preferably includes an polyesterpolyol residue and at least one of isophoronediisocyanate residue and hexane-1,6-diisocyanate residue. Furthermore, the polyesterpolyol residue preferably includes at least one of a neopentyl glycol residue and a propylene glycol residue and at least one of an adipic acid residue and a phthalate residue. In this case, turning yellow of the aliphatic urethane convergence agent is particularly suppressed, and thus turning yellow and the degradation in the light reflectance of the light-reflecting body due to light and heat can be particularly suppressed. In particular, the aliphatic urethane convergence agent includes isophorone diisocyanate residue and hexane-1,6-diisocyanate residue as the isocyanate residues, and the neopentyl glycol residue, the propylene glycol residue, the adipic acid residue, and the phthalate residue as the polyester polyol residues.

The percentage of the aliphatic urethane convergence agent with respect to the fibrous filler is not particularly limited. However, it is preferably in a range from 0.05% by mass to 0.4% by mass, inclusive, and more preferably from 0.05% by mass to 0.29% by mass, inclusive.

The percentage of the fibrous filler with respect to the total molding material is preferably in a range from 3% by mass to 20% by mass, inclusive, and more preferably from 5% by mass to 15% by mass, inclusive. In these cases, the bending strength of the light-reflecting body particularly improves. In addition, in these cases, a material shrinkage can be reduced. In other words, cracks on the light-reflecting body can be suppressed from generating typically in a temperature cycle test.

The percentage of the filler with respect to the total molding material is preferably in a range from 20% by mass to 90% by mass, inclusive. In this range, good fluidity of the molding material can be secured during molding. In particular, when the MAP method is adopted to fabricate the light-reflecting body from the molding material, the percentage of the filler with respect to the total molding material is preferably in a range from 75% by mass to 90% by mass, inclusive. When the transfer molding method is used, instead of the MAP method, for molding each piece from the molding material, so as to mold one light-reflecting body per cavity, the percentage of the filler with respect to the total molding material is preferably from 50% by mass to 90% by mass, inclusive, and more preferably from 60% by mass to 85% by mass, inclusive.

The molding material preferably includes an antioxidant. In this case, discoloration of the light-reflecting body is further suppressed, and the degradation with time of the light reflectance of the light-reflecting body further hardly occurs. For example, the antioxidant can contain one or more compounds selected from the group consisting of phenolic antioxidants and phosphorous antioxidants. The antioxidant preferably does not include a compound generating chromophore.

In particular, the molding material preferably contains a phosphorous antioxidant. In this case, turning yellow on processing and with time of the light-reflecting body is further suppressed, and thus the degradation in the light reflectance of the light-reflecting body is therefore further suppressed. In particular, when the molding material contains phosphorous antioxidant in addition to tryglycidyl isocyanurate, the degradation in the light reflectance of the light-reflecting body is drastically suppressed.

For example, the phosphorous antioxidant can contain one or more compounds selected from the group consisting of 9,10-dihydro-9-oxa-10-phosphaphenanthrene-10-oxide, 3,9-bis(2,6-di-tert-butyl-4-methylphenoxy)-2,4,8,10-tetraoxa-3,9-diphosphaspiro[5,5]undecane, bis(nonilphenyl) pentaerythritol-di-phosphite, and distearylpentaerythritol-di-phosphite. The percentage of the phosphorous antioxidant in the molding material is preferably in a range from 0.1% by mass to 0.5% by mass, inclusive.

The molding material also preferably includes sulfur-based antioxidant. A specific example of sulfur-based antioxidant is ADK STAB AO-412S by ADEKA Corporation. The percentage of sulfur-based antioxidant in the molding material is preferably not greater than 0.5% by mass, and more preferably from 0.01% by mass to 0.5% by mass, inclusive.

The molding material may include a mold release agent. The mold release agent can contain one or more materials selected from the group consisting of generally used a fatty acid-based wax, a fatty acid metal salt-based wax, and a mineral-based wax. In particular, the mold release agent preferably contains the fatty acid-based wax or the fatty acid metal salt-based wax that have good heat discoloration resistance.

In particular, the mold release agent preferably contains one or more materials selected from the group consisting of stearic acid, zinc stearate, aluminum stearate, and calcium stearate.

Mass of the mold release agent with respect to 100 parts by mass of the thermosetting resin is preferably in a range from 1 part by mass to 15 parts by mass, inclusive. In this case, both good mold release of the light-reflecting body on molding and good appearance of the light-reflecting body are achieved, and also the light reflectivity of the light-reflecting body particularly increases.

The molding material may contain additives other than the above components as required, such as a coloring agent, a thickener, a flame retardant, and a flexibility providing agent.

The molding material may be solid. In this case, storage stability and handling of the molding material improves. For example, the molding material may be granule or powder. In particular, the molding material is preferably solid at 30° C. or below. In this case, the molding material can be easily granulated by crushing or pelletizing. The molding material also preferably has shape retainability at 50° C. or below. In this case, handling of the molding material and workability on using the molding material particularly improves.

The molding material may be prepared without solvent. In this case, a solid molding material can be easily prepared.

For preparing the molding material, aforementioned raw materials are blended at predetermined ratios and mixed by a mixer or a blender, to prepare a mixture. This mixture is then kneaded typically by a kneader or a protruder that can heat and pressurize the mixture. As the kneader, for example, a pressurizing kneader, a heat roll, and an extruder can be used. A heating temperature during kneading is preferably in a range from 80 to 120° C. In this case, the first unsaturated polyester is melted without being hardened, thus increasing uniformity of the molding material.

Then, a bulk mixture is crushed and sized or further granulated as required to obtain granule, powder, pellet, or the like of the molding material. On crushing, the first unsaturated polyester in the exemplary embodiment hardly melts, and thus the degradation in the light reflectance of the light-reflecting body due to metal rubbing can be suppressed.

The molding material in the exemplary embodiment contains the aforementioned first unsaturated polyester, thus it shows high fluidity on molding. Since the first unsaturated polyester is contained, a spiral flow length at 170° C. of the molding material in the exemplary embodiment is preferably 30 cm or longer. Since the first unsaturated polyester is contained, torque at 170° C. of the molding material in the exemplary embodiment measured by a curelastometer is also preferably 1.96 N·m (20 kgf·cm) or greater. In this case, the fluidity of the molding material is particularly good. This facilitates molding using the transfer molding method, and also suppresses generation of burrs on the light-reflecting body.

If the filler does not contain the fibrous filler, the fluidity of the molding material becomes particularly high on molding. If the molding material contains the first unsaturated polyester and does not contain the fibrous filler, a spiral flow length of the molding material at 170° becomes 50 cm or longer, and a torque at 170° C. measured by curelastometer becomes 1.96 N·m (20 kgf·cm) or greater. In this case, moldability becomes particularly good when the mold array package (MAP) method is adopted for fabricating the light-reflecting body.

The light-reflecting body can be fabricated by molding and curing the molding material. As a molding method, an appropriate melt and heat molding method, such as injection molding method, injection compression molding method, and transfer molding method, is applicable. In particular, as described above, the transfer molding method is preferably applied because of its low cost and ease of mass production. Molding conditions in the transfer molding method are, for example, a range from 130 to 180° C. for mold temperature, from 5 to 20 MPa for transfer pressure, from 30 to 300 sec for curing time, and preferably from 30 to 180 sec. Post curing treatment may also be applied as required.

Figure 2:
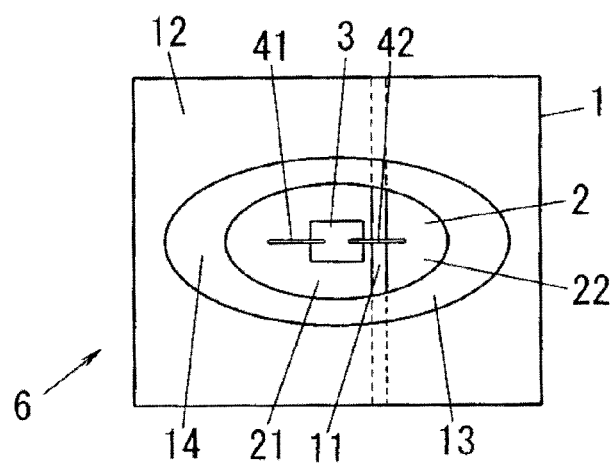
FIG. 2 is a plan view of the lighting fixture shown in FIG. 1.

FIG. 1 and FIG. 2 are a sectional view and a plan view, respectively, of lighting fixture 6 having light-reflecting body 1 fabricated using the molding material in the exemplary embodiment. Lighting fixture 6 includes light-reflecting body 1, metal lead 2, and light-emitting element 3. In lighting fixture 6, lead 2 is embedded in light-reflecting body 1 so as to combine light-reflecting body 1 and lead 2. However, the structures of light-reflecting body 1 and lighting fixture 6 are not limited to this example.

Lead 2 includes first lead 21 and second lead 22. Light-reflecting body 1 includes main body 12 overlaid on lead 2 and intervening member 11 between first lead 21 and second lead 22. Recessed part 13 opened to the top face is created in main body 12. First lead 21 and second lead 22 are exposed inside recessed part 13 at the bottom face of recessed part 13. Insulating member 5 crossing from first lead 21 to second lead 22 is provided on the bottom face of lead 2 to suppress short-circuiting between first lead 21 and second lead 22.

Light-emitting element 3 is, for example, a light-emitting diode, but not limited to the light-emitting diode. Light-emitting element 3 is mounted on first lead 21 in recessed part 13. In addition, in recessed part 13, light-emitting element 3 and first lead 21 are electrically coupled by first wire 41, and light-emitting element 3 and second lead 22 are coupled by second wire 42.

The inner diameter of recessed part 23 of light-reflecting body 1 is larger toward the open side. In other words, inner peripheral face 14 of recessed part 13 is sloped. Therefore, the light emitted from light-emitting element 3 likely reflects on inner peripheral face 14 of recessed part 13 in light-reflecting body 1. As a result, the light extraction efficiency of lighting fixture 6 is high.

In lighting fixture 6, recessed part 13 may be sealed with transparent resin or the opening of recessed part 13 may be closed with a transparent cover, as required.

This type of light-reflecting body 1, in which lead 2 is embedded, is manufactured by the insert molding method, for example. More specifically, for example, a lead frame including lead 2 is disposed inside a transfer mold, and the molding material is molded inside transfer molds in this state and lead 2 is separated from the lead frame as required to fabricate light-reflecting body 1.

Figure 3:
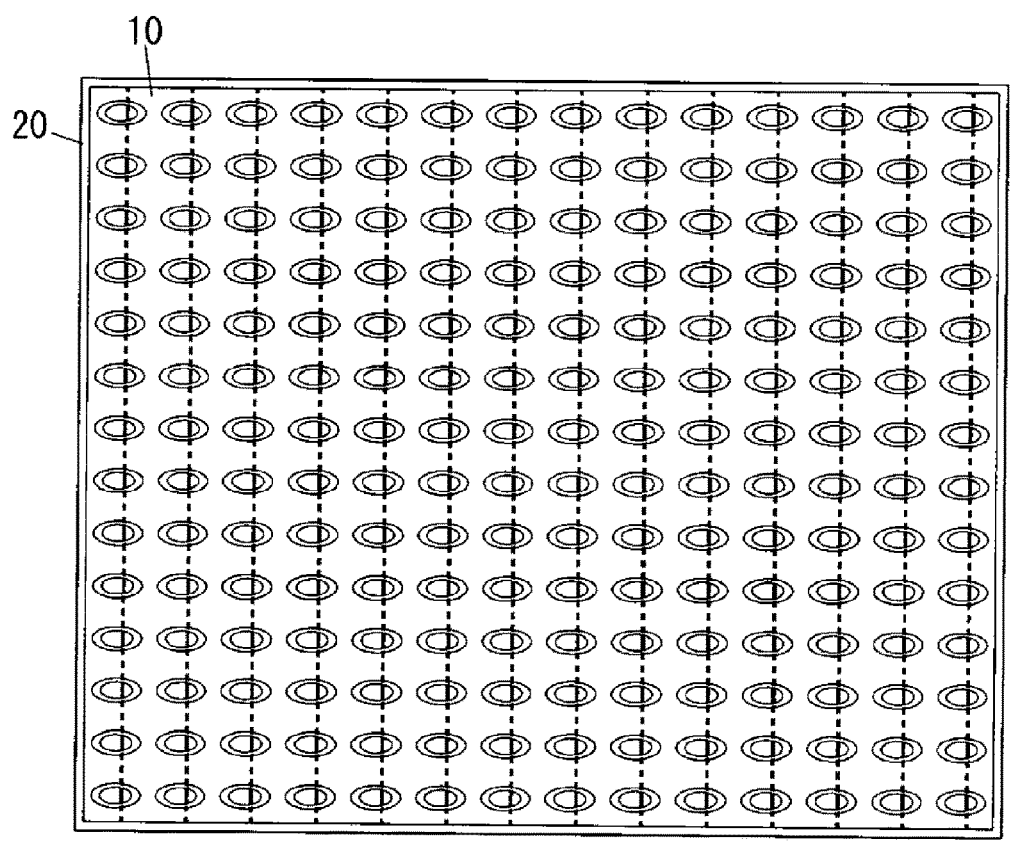
FIG. 3 is a plan view of a molded body obtained during manufacturing the light-reflecting body shown in FIG. 2, using the MAP method.

A method of fabricating light-reflecting body 1 in which lead 2 is embedded by transfer molding is described with reference to FIG. 3. FIG. 3 is a plan view of a molded body obtained when fabricating light-reflecting body 1 by transfer molding.

First, for example, lead frame 20 including leads 2 is prepared. Then, lead frame 20 is disposed inside the transfer mold, and the molding material is transfer-molded inside the transfer molds in this state. Thus, molded body 10 in which lead frame 20 is embedded is fabricated. By cutting molded body 10 typically using a dicing saw, light-reflecting bodies 1 are obtained.

Hereinafter, advantages of the exemplary embodiment are described with reference to specific examples.

[Preparation of Unsaturated Polyester]

Raw material monomer of composition shown in Table 1 is placed in a container. A temperature is increased and condensed water is purged while replacing the inside of the container with inert gas so as to allow the raw material monomer to react. The acid number of the reaction product is confirmed to be in a range from 5 to 40 mg-KOH/g, and then the reaction is terminated, thereby crystalline unsaturated polyester is prepared.

Table 1 also shows the iodine number, the melting point, and the ICI viscosity at 150° C. of each unsaturated polyester. The melting point is a value measured while increasing the temperature of unsaturated polyester at a rate of 10° C. per minute, using a differential scanning calorimeter (DSC).

TABLE 1

|  |  |  | A | B | C | D | E | F | G | H |
|---|---|---|---|---|---|---|---|---|---|---|
| Monomer composition (Mole ratio) | Polybasic acids | Fumaric acid | 100 | 100 | 100 | 100 | 85 | 80 | 100 | 100 |
|  |  | Terephthalic acid |  |  |  |  | 20 | 5 |  |  |
|  |  | Isophthalic acid |  |  |  |  |  |  |  |  |
|  |  | 1,4-cyclohexanedicarboxylic acid |  |  |  |  |  | 15 |  |  |
|  |  | Total | 100 | 100 | 100 | 100 | 105 | 100 | 100 | 100 |
|  | Polyols | 1,6-hexanediol | 92 | 100 | 85 | 92 | 92 | 92 | 74 |  |
|  |  | 1,4-butanediol |  |  |  |  |  |  |  | 92 |
|  |  | Cyclohexane1,4-dimethanol |  |  |  |  |  |  | 18 |  |
|  |  | Neopentyl glycol | 18 | 10 | 25 | 18 | 18 | 18 | 18 | 18 |
|  |  | Trimethylolpropane |  |  |  | 2 |  |  |  |  |
|  |  | Total | 110 | 110 | 110 | 112 | 110 | 110 | 110 | 110 |
| Iodine number |  |  | 100 | 100 | 100 | 90 | 85 | 90 | 100 | 90 |
| Melting point (° C.) |  |  | 80 | 90 | 75 | 70 | 85 | 70 | 75 | 90 |
| Glass transition temperature |  |  | 40 | 40 | 40 | 40 | 40 | 40 | 38 | 40 |
| ICI viscosity at 150° C. (Pa · s) |  |  | 1.8 | 1 | 2 | 1.8 | 3 | 1.8 | 1.8 | 6 |

[Preparation of Molding Material for Light-Reflecting Body]

Resin components and fillers with compositions shown in Table 2 to Table 7 are prepared, and the fillers are blended to achieve values indicated in "Percentage of fillers in molding material" in the tables. Each amount of raw material indicated in a column of "Resin component composition" in the tables is parts by mass. Each amount of raw material indicated in a column of "Filler composition" is mass ratio among the fillers, and the percentage of fillers in the molding material shows parts by mass. Each set of raw materials is evenly mixed using a sigma blender and kneaded by a heat roll heated to 100° C. to prepare a sheet-like kneaded mixture. The kneaded mixture is cooled, crashed, and sized to prepare granulated molding material.

The tables also show measurement results of a spiral flow length at 170° C. and torque measured by curelastometer of the molding material at 170° C. To measure spiral flow, a spiral flow measurement die in accordance with the EMMI-1-66 standards is used. The molding material is molded under molding conditions of the mold temperature at 170° C. and molding pressure of 6.9 MPa to obtain a flow distance (cm). To measure torque by curelastometer, the molding material is heated at 170° C., and the torque is measured after 180 sec passes from the start of heating.

Details of raw materials shown in the tables, other than the unsaturated polyesters, are as follows.

Cross-Linking Agent

Diallyl phthalate monomer: DAP monomer produced by Osaka Soda Co., Ltd., Molecular weight: 246.3, Viscosity at 30° C.: 8.5 mPa·s, Iodine number: 202, Liquid at ordinary temperatures, Melting point: 290° C.

Triallyl isocyanurate: TAIC produced by Nihon Kasei Co., Ltd., Molecular weight: 249, Viscosity: 80 to 110 mPa/s (30° C.), Melting point: 27° C., Boiling point: 162° C. (2 mmHg)

Styrene: Styrene monomer produced by Asahi Kasei Chemicals Corporation, Melting point: 145° C.

Diallyl phthalate prepolymer: ISO DAP produced by Osaka Soda Co., Ltd., Weight-average molecular weight (polystyrene equivalent) $3 \times 10^4$ to $5 \times 10^4$, Melt viscosity at 120° C.: 1 kPa·s, Iodine number: 78, Softening point: 50 to 80° C., Boiling point 150° C. or above Curing Accelerator Dicumyl peroxide produced by NOF Corporation Mold Release Agent Zinc stearate: SZ-P produced by Sakai Chemical Industry Co., Ltd.

Antioxidant

HCA: Phosphorous antioxidant, 9,10-dihydro-9-oxa-10-phosphahenanthrene-oxide, produced by SANKO Co., Ltd.

AO-60: Hindered phenolic antioxidant, ADK STAB AO-60 produced by ADEKA Corporation AO-412S: Sulfur-based antioxidant, ADK STAB AO-412S produced by ADEKA Corporation White Pigment Titanium oxide: Rutile type titanium oxide, Average particle size: 0.4 μm, Tioxide RTC-30 produced by Tioxide Japan Limited Zinc oxide: Zinc Oxide Type I produced by Sakai Chemical Industry, Specific gravity: 5.6, Average particle size: 0.6 μm Inorganic Filler Silica: Molten silica, FB-820 produced by Denka Company Limited, Average particle size: 25 μm Aluminum oxide: DAW-05 produced by Denka Company Limited, Average particle size: 0.5 μm Hollow particles: Glass hollow particles, Glass Bubbles, Type No. S60-HS produced by 3M Japan Limited, Average particle size: 30 μm Fibrous Filler Glass fiber: a product of raw glass fiber after surface treatments; the raw glass fiber has an average fiber length of 3 mm, an average fiber diameter of 10.5 μm, a moisture content of 0.02%, an ignition loss of 0.28%. The raw glass fiber is processed the surface treatment by an aminosilane coupling agent and the surface treatment by an aliphatic urethane convergence agent in this order: Isocyanate residue in the aliphatic urethane convergence agent includes 80 mol % or more isophorone diisocyanate residue and 20 mol % or less hexane1,6-diisocyanate residue. Polyester polyol residue in the aliphatic urethane convergence agent includes neopentyl glycol residue, propylene glycol residue, adipic acid residue, and phthalate residue.

Evaluation (Light Reflectance)

1. Initial

The molding material is transfer-molded to prepare evaluation samples. Transfer molding conditions are follows: the mold temperature is 150° C., the transfer pressure is 8 MPa, and the curing time is 90 sec. Dimensions of each of the evaluation samples are follows: the diameter is 5 cm and the thickness is 1 mm.

The light reflectance of each of these evaluation samples at wavelength of 460 nm is measured using spectral colorimeter CM-3500d manufactured by Konica Minolta, Inc.

2. After Heat Treatment

After heating the evaluation samples at 150° C. for 1000 hours, the light reflectance of each of these samples at wavelength of 460 nm is measured.

3. After UV Irradiation and Heat Treatment

While irradiating UV light using an HID lamp (high pressure mercury lamp) as a light source, the evaluation samples are heated at 140° C. for 1000 hours. Then, the light reflectance of each of these samples at wavelength of 460 nm is measured.

4. After High-Temperature and High-Humidity Treatment

The evaluation samples are left under 85° C. and 85% RH for 1000 hours, and then the light reflectance of each of these samples for evaluation at wavelength of 460 nm is measured.

(Odor During Molding)

Evaluation samples are prepared under the same conditions as those for evaluating the above light reflectance. Sensory evaluation of odor in the surrounding environment of the molds during molding is conducted. Based on results, the samples are evaluated as NG if potent odor is noticed, and OK if not.

(Storage Stability)

The molding materials obtained as the samples and the comparison samples are analyzed immediately after preparation, using a differential scanning calorimeter (DSC), to evaluate a calorific value at heat generation. These molding materials are stored at 20° C. for 1 month, and then a calorific value at heat generation is measured again. Results are evaluated as A when the calorific value of the molding material after storage is 80% or more of the calorific value of the molding material immediately after preparation, and B when less than 80%.

(Individual Moldability)

A set of transfer molds with hollow of 3 mm×3 mm×1 mm is used for transfer-molding the molding material so as to prepare evaluation samples of light-reflecting bodies. Transfer molding conditions are follows: the mold temperature is 170° C., the transfer pressure is 8 Mpa, and the curing time is 90 sec.

2500 pieces of evaluation samples are prepared and observed to confirm presence of any insufficient filling. The number of defective evaluation samples is counted for evaluating moldability.

(Moldability in MAP Method)

A set of molds for integrated molding is equipped. The set of molds is provided with a single cavity in which 196 cavities with dimensions of 3 mm×3 mm×1 mm are disposed in matrix of 14 lines and 14 rows. In a state a copper lead frame is set in the set of molds, the molding material is transfer-molded. Transfer-molding conditions are follows: the mold temperature is 170° C., the transfer pressure is 8 MPa, and the curing time is 90 sec. The single obtained molded body is cut by a dicing saw to cut out 196 light-reflecting bodies.

For evaluation, ten pieces of the molded bodies are molded to prepare 1960 pieces of the light-reflecting bodies as evaluation samples. Each of these evaluation samples is observed to confirm presence of any insufficient filling. The number of defective evaluation samples is counted for evaluating moldability.

TABLE 2

| | | | Sample | | | | | | | |
|---|---|---|---|---|---|---|---|---|---|---|
| | | | 1 | 2 | 3 | 4 | 5 | 6 | 7 | 8 |
| Resin component composition | Unsaturated polyester | Unsaturated polyester A | 94 | 94 | 94 | 94 | 94 | 97 | 88 | 94 |
| | | Unsaturated polyester B | 0 | 0 | 0 | 0 | 0 | 0 | 0 | 0 |
| | | Unsaturated polyester C | 0 | 0 | 0 | 0 | 0 | 0 | 0 | 0 |
| | | Unsaturated polyester D | 0 | 0 | 0 | 0 | 0 | 0 | 0 | 0 |
| | | Unsaturated polyester E | 0 | 0 | 0 | 0 | 0 | 0 | 0 | 0 |
| | | Unsaturated polyester F | 0 | 0 | 0 | 0 | 0 | 0 | 0 | 0 |
| | | Unsaturated polyester G | 0 | 0 | 0 | 0 | 0 | 0 | 0 | 0 |
| | | Unsaturated polyester H | 0 | 0 | 0 | 0 | 0 | 0 | 0 | 0 |
| | Cross-linking agent | Diallyl phthalate monomer | 6 | 6 | 6 | 6 | 6 | 3 | 12 | 0 |
| | | Triallyl isocyanurate | 0 | 0 | 0 | 0 | 0 | 0 | 0 | 6 |
| | | Diallyl phthalate prepolymer | 0 | 0 | 0 | 0 | 0 | 0 | 0 | 0 |
| | | Diethylene glycol dimethacrylate | 0 | 0 | 0 | 0 | 0 | 0 | 0 | 0 |
| | | Styrene | 0 | 0 | 0 | 0 | 0 | 0 | 0 | 0 |
| | Curing accelerator | Dicumyl peroxide | 2 | 2 | 2 | 2 | 2 | 2 | 2 | 2 |
| | Mold release agent | Zinc stearate | 1 | 1 | 1 | 1 | 1 | 1 | 1 | 1 |
| | Antioxidant | HCA | 0.2 | 0.2 | 0.2 | 0.2 | 0.2 | 0.2 | 0.2 | 0.2 |
| | | AO-60 | 0.2 | 0.2 | 0.2 | 0.2 | 0.2 | 0.2 | 0.2 | 0.2 |
| | | AO-412S | 0 | 0 | 0 | 0 | 0 | 0 | 0 | 0 |
| | Total of resin components | | 103.4 | 103.4 | 103.4 | 103.4 | 103.4 | 103.4 | 103.4 | 103.4 |
| Filler composition | White pigment | Titanium oxide | 60 | 60 | 60 | 45 | 50 | 60 | 60 | 60 |
| | | Zinc oxide | 0 | 0 | 0 | 0 | 0 | 0 | 0 | 0 |
| | Inorganic filler | Silica | 25 | 25 | 25 | 40 | 35 | 25 | 25 | 25 |
| | | Aluminum oxide | 0 | 0 | 0 | 0 | 0 | 0 | 0 | 0 |
| | | Hollow filler | 0 | 0 | 0 | 0 | 0 | 0 | 0 | 0 |
| | Fibrous filler (glass fiber) | | 15 | 15 | 15 | 15 | 15 | 15 | 15 | 15 |
| | Total of fillers | | 100 | 100 | 100 | 100 | 100 | 100 | 100 | 100 |

TABLE 2-continued

|  |  | Sample |  |  |  |  |  |  |  |
|---|---|---|---|---|---|---|---|---|---|
|  |  | 1 | 2 | 3 | 4 | 5 | 6 | 7 | 8 |
| Percentage of fillers in molding material (% by mass) |  | 65 | 55 | 75 | 65 | 65 | 65 | 65 | 65 |
| Evaluation | Spiral flow length (cm) | 70 | 85 | 45 | 65 | 78 | 56 | 100 | 75 |
|  | Curelastometer torque (N · m) | 3.9 | 3.4 | 4.9 | 3.9 | 3.9 | 3.9 | 3.9 | 3.9 |
|  | Light reflectance Initial (%) | 94 | 93 | 95 | 95 | 95 | 94 | 95 | 95 |
|  | After heat treatment (%) | 83 | 83 | 83 | 85 | 86 | 85 | 84 | 85 |
|  | After UV irradiation and heat treatment (%) | 83 | 83 | 83 | 85 | 86 | 85 | 84 | 85 |
|  | After high-temperature and high-humidity treatment (%) | 87 | 85 | 90 | 90 | 90 | 90 | 90 | 90 |
|  | Odor during molding | OK | OK | OK | OK | OK | OK | OK | OK |
|  | Storage stability | A | A | A | A | A | A | A | A |
|  | Individual moldability (pcs/2500 pcs) | 1 | 0 | 11 | 0 | 0 | 0 | 0 | 0 |
|  | Moldability in MAP method (pcs/1960 pcs) | — | — | — | — | — | — | — | — |

TABLE 3

|  |  |  | Sample |  |  |  |  |  |  |
|---|---|---|---|---|---|---|---|---|---|
|  |  |  | 9 | 10 | 11 | 12 | 13 | 14 | 15 |
| Resin component composition | Unsaturated polyester | Unsaturated polyester A | 0 | 0 | 0 | 0 | 0 | 0 | 84 |
|  |  | Unsaturated polyester B | 94 | 0 | 0 | 0 | 0 | 0 | 0 |
|  |  | Unsaturated polyester C | 0 | 94 | 0 | 0 | 0 | 0 | 0 |
|  |  | Unsaturated polyester D | 0 | 0 | 94 | 0 | 0 | 0 | 0 |
|  |  | Unsaturated polyester E | 0 | 0 | 0 | 94 | 0 | 0 | 0 |
|  |  | Unsaturated polyester F | 0 | 0 | 0 | 0 | 94 | 0 | 0 |
|  |  | Unsaturated polyester G | 0 | 0 | 0 | 0 | 0 | 94 | 0 |
|  |  | Unsaturated polyester H | 0 | 0 | 0 | 0 | 0 | 0 | 0 |
|  | Cross-linking agent | Diallyl phthalate monomer | 6 | 6 | 6 | 6 | 6 | 6 | 6 |
|  |  | Triallyl isocyanurate | 0 | 0 | 0 | 0 | 0 | 0 | 0 |
|  |  | Diallyl phthalate prepolymer | 0 | 0 | 0 | 0 | 0 | 0 | 10 |
|  |  | Diethylene glycol dimethacrylate | 0 | 0 | 0 | 0 | 0 | 0 | 0 |
|  |  | Styrene | 0 | 0 | 0 | 0 | 0 | 0 | 0 |
|  | Curing accelerator | Dicumyl peroxide | 2 | 2 | 2 | 2 | 2 | 2 | 2 |
|  | Mold release agent | Zinc stearate | 1 | 1 | 1 | 1 | 1 | 1 | 1 |
|  | Antioxidant | HCA | 0.2 | 0.2 | 0.2 | 0.2 | 0.2 | 0.2 | 0.2 |
|  |  | AO-60 | 0.2 | 0.2 | 0.2 | 0.2 | 0.2 | 0.2 | 0.2 |
|  |  | AO-412S | 0 | 0 | 0 | 0 | 0 | 0 | 0 |
|  | Total of resin components |  | 103.4 | 103.4 | 103.4 | 103.4 | 103.4 | 103.4 | 103.4 |
| Filler composition | White pigment | Titanium oxide | 60 | 60 | 60 | 60 | 60 | 60 | 60 |
|  |  | Zinc oxide | 0 | 0 | 0 | 0 | 0 | 0 | 0 |
|  | Inorganic filler | Silica | 25 | 25 | 25 | 25 | 25 | 25 | 25 |
|  |  | Aluminum oxide | 0 | 0 | 0 | 0 | 0 | 0 | 0 |
|  |  | Hollow filler | 0 | 0 | 0 | 0 | 0 | 0 | 0 |
|  | Fibrous filler (glass fiber) |  | 15 | 15 | 15 | 15 | 15 | 15 | 15 |
|  | Total of fillers |  | 100 | 100 | 100 | 100 | 100 | 100 | 100 |
| Percentage of fillers in molding material (% by mass) |  |  | 65 | 65 | 65 | 65 | 65 | 65 | 65 |
| Evaluation | Spiral flow length (cm) |  | 75 | 80 | 85 | 75 | 80 | 80 | 70 |
|  | Curelastometer torque (N · m) |  | 3.9 | 3.9 | 3.9 | 3.9 | 3.9 | 3.9 | 3.9 |
|  | Light reflectance | Initial (%) | 94 | 93 | 92 | 91 | 91 | 91 | 90 |
|  |  | After heat treatment (%) | 83 | 81 | 79 | 77 | 78 | 79 | 75 |
|  |  | After UV irradiation and heat treatment (%) | 83 | 81 | 79 | 77 | 78 | 78 | 75 |
|  |  | After high-temperature and high-humidity treatment (%) | 90 | 90 | 90 | 90 | 90 | 90 | 90 |
|  | Odor during molding |  | OK | OK | OK | OK | OK | OK | OK |
|  | Storage stability |  | A | A | A | A | A | A | A |
|  | Individual moldability (pcs/2500 pcs) |  | 0 | 0 | 0 | 0 | 0 | 0 | 0 |
|  | Moldability in MAP method (pcs/1960 pcs) |  | — | — | — | — | — | — | — |

TABLE 4

|  |  |  | Sample |  |  |  | Comparison sample |  |  |
|---|---|---|---|---|---|---|---|---|---|
|  |  |  | 16 | 17 | 18 | 19 | 1 | 2 | 3 |
| Resin component composition | Unsaturated polyester | Unsaturated polyester A | 74 | 94 | 94 | 94 | 0 | 0 | 0 |
|  |  | Unsaturated polyester B | 0 | 0 | 0 | 0 | 0 | 0 | 0 |
|  |  | Unsaturated polyester C | 0 | 0 | 0 | 0 | 0 | 0 | 0 |
|  |  | Unsaturated polyester D | 0 | 0 | 0 | 0 | 0 | 0 | 0 |
|  |  | Unsaturated polyester E | 0 | 0 | 0 | 0 | 0 | 0 | 0 |
|  |  | Unsaturated polyester F | 0 | 0 | 0 | 0 | 0 | 0 | 0 |
|  |  | Unsaturated polyester G | 0 | 0 | 0 | 0 | 0 | 0 | 0 |
|  |  | Unsaturated polyester H | 0 | 0 | 0 | 0 | 90 | 94 | 94 |
|  | Cross-linking agent | Diallyl phthalate monomer | 6 | 6 | 6 | 6 | 0 | 0 | 6 |
|  |  | Triallyl isocyanurate | 0 | 0 | 0 | 0 | 0 | 0 | 0 |
|  |  | Diallyl phthalate prepolymer | 20 | 0 | 0 | 0 | 0 | 0 | 0 |
|  |  | Diethylene glycol dimethacrylate | 0 | 0 | 0 | 0 | 3 | 3 | 0 |
|  |  | Styrene | 0 | 0 | 0 | 0 | 18 | 3 | 0 |
|  | Curing accelerator | Dicumyl peroxide | 2 | 2 | 2 | 2 | 2 | 2 | 2 |
|  | Mold release agent | Zinc stearate | 1 | 1 | 1 | 1 | 1 | 1 | 1 |
|  | Antioxidant | HCA | 0.2 | 0.2 | 0.2 | 0 | 0.2 | 0.2 | 0.2 |
|  |  | AO-60 | 0.2 | 0.2 | 0.2 | 0.2 | 0.2 | 0.2 | 0.2 |
|  |  | AO-412S | 0 | 0 | 0.2 | 0.2 | 0 | 0 | 0 |
|  | Total of resin components |  | 103.4 | 103.4 | 103.4 | 103.2 | 114.4 | 103.4 | 103.4 |
| Filler composition | White pigment | Titanium oxide | 60 | 0 | 0 | 60 | 60 | 60 | 60 |
|  |  | Zinc oxide | 0 | 60 | 60 | 0 | 0 | 0 | 0 |
|  | Inorganic filler | Silica | 25 | 25 | 25 | 25 | 25 | 25 | 25 |
|  |  | Aluminum oxide | 0 | 0 | 0 | 0 | 0 | 0 | 0 |
|  |  | Hollow filler | 0 | 0 | 0 | 0 | 0 | 0 | 0 |
|  | Fibrous filler (glass fiber) |  | 15 | 15 | 15 | 15 | 15 | 15 | 15 |
|  | Total of fillers |  | 100 | 100 | 100 | 100 | 100 | 100 | 100 |
| Percentage of fillers in molding material (% by mass) |  |  | 65 | 65 | 65 | 65 | 65 | 65 | 65 |
| Evaluation | Spiral flow length (cm) |  | 70 | 85 | 85 | 70 | 3 | 3 | 3 |
|  | Curelastometer torque (N · m) |  | 3.9 | 3.9 | 3.9 | 3.9 | 2.5 | 2.0 | 2.5 |
|  | Light reflectance | Initial (%) | 89 | 88 | 94 | 94 | 85 | 87 | 88 |
|  |  | After heat treatment (%) | 73 | 71 | 87 | 86 | 65 | 65 | 78 |
|  |  | After UV irradiation and heat treatment (%) | 73 | 71 | 87 | 86 | 68 | 65 | 71 |
|  |  | After high-temperature and high-humidity treatment (%) | 90 | 90 | 87 | 87 | 82 | 84 | 86 |
|  | Odor during molding |  | OK | OK | OK | OK | NG | NG | OK |
|  | Storage stability |  | A | A | A | A | B | B | B |
|  | Individual moldability (pcs/2500 pcs) |  | 0 | 0 | 0 | 1 | 150 | 230 | 75 |
|  | Moldability in MAP method (pcs/1960 pcs) |  | — | — | — | — | — | — | — |

TABLE 5

|  |  |  | Sample |  |  |  |  |  |  |  |
|---|---|---|---|---|---|---|---|---|---|---|
|  |  |  | 20 | 21 | 22 | 23 | 24 | 25 | 26 | 27 |
| Resin component composition | Unsaturated polyester | Unsaturated polyester A | 94 | 94 | 94 | 94 | 94 | 97 | 88 | 94 |
|  |  | Unsaturated polyester B | 0 | 0 | 0 | 0 | 0 | 0 | 0 | 0 |
|  |  | Unsaturated polyester C | 0 | 0 | 0 | 0 | 0 | 0 | 0 | 0 |
|  |  | Unsaturated polyester D | 0 | 0 | 0 | 0 | 0 | 0 | 0 | 0 |
|  |  | Unsaturated polyester E | 0 | 0 | 0 | 0 | 0 | 0 | 0 | 0 |
|  |  | Unsaturated polyester F | 0 | 0 | 0 | 0 | 0 | 0 | 0 | 0 |
|  |  | Unsaturated polyester G | 0 | 0 | 0 | 0 | 0 | 0 | 0 | 0 |
|  |  | Unsaturated polyester H | 0 | 0 | 0 | 0 | 0 | 0 | 0 | 0 |
|  | Cross-linking agent | Diallyl phthalate monomer | 6 | 6 | 6 | 6 | 6 | 3 | 12 | 0 |
|  |  | Triallyl isocyanurate | 0 | 0 | 0 | 0 | 0 | 0 | 0 | 6 |
|  |  | Diallyl phthalate prepolymer | 0 | 0 | 0 | 0 | 0 | 0 | 0 | 0 |
|  |  | Diethylene glycol dimethacrylate | 0 | 0 | 0 | 0 | 0 | 0 | 0 | 0 |
|  |  | Styrene | 0 | 0 | 0 | 0 | 0 | 0 | 0 | 0 |
|  | Curing accelerator | Dicumyl peroxide | 2 | 2 | 2 | 2 | 2 | 2 | 2 | 2 |
|  | Mold release agent | Zinc stearate | 1 | 1 | 1 | 1 | 1 | 1 | 1 | 1 |

TABLE 5-continued

|  |  |  | Sample | | | | | | | |
|---|---|---|---|---|---|---|---|---|---|---|
|  |  |  | 20 | 21 | 22 | 23 | 24 | 25 | 26 | 27 |
|  | Antioxidant | HCA | 0.2 | 0.2 | 0.2 | 0.2 | 0.2 | 0.2 | 0.2 | 0.2 |
|  |  | AO-60 | 0.2 | 0.2 | 0.2 | 0.2 | 0.2 | 0.2 | 0.2 | 0.2 |
|  |  | AO-412S | 0 | 0 | 0 | 0 | 0 | 0 | 0 | 0 |
|  | Total of resin components | | 103.4 | 103.4 | 103.4 | 103.4 | 103.4 | 103.4 | 103.4 | 103.4 |
| Filler | White | Titanium oxide | 25 | 25 | 25 | 25 | 25 | 25 | 25 | 25 |
| composition | pigment | Zinc oxide | 0 | 0 | 0 | 0 | 0 | 0 | 0 | 0 |
|  | Inorganic | Silica | 65 | 65 | 65 | 65 | 65 | 65 | 65 | 65 |
|  | filler | Aluminum oxide | 0 | 0 | 0 | 0 | 0 | 0 | 0 | 0 |
|  |  | Hollow filler | 10 | 10 | 10 | 10 | 10 | 10 | 10 | 10 |
|  | Fibrous filler (glass fiber) | | 0 | 0 | 0 | 0 | 0 | 0 | 0 | 0 |
|  | Total of fillers | | 100 | 100 | 100 | 100 | 100 | 100 | 100 | 100 |
| Percentage of fillers in molding material (% by mass) | | | 75 | 70 | 80 | 75 | 75 | 75 | 75 | 75 |
| Evaluation | Spiral flow length (cm) | | 70 | 85 | 45 | 65 | 78 | 56 | 100 | 75 |
|  | Curelastometer torque (N · m) | | 3.9 | 3.4 | 4.9 | 3.9 | 3.9 | 3.9 | 3.9 | 3.9 |
|  | Light | Initial (%) | 94 | 93 | 95 | 95 | 95 | 94 | 95 | 95 |
|  | reflectance | After heat treatment (%) | 83 | 83 | 83 | 85 | 86 | 85 | 84 | 85 |
|  |  | After UV irradiation and heat treatment (%) | 83 | 83 | 83 | 85 | 86 | 85 | 84 | 85 |
|  |  | After high-temperature and high-humidity treatment (%) | 90 | 89 | 91 | 90 | 90 | 90 | 90 | 90 |
|  | Odor during molding | | OK | OK | OK | OK | OK | OK | OK | OK |
|  | Storage stability | | A | A | A | A | A | A | A | A |
|  | Individual moldability (pcs/2500 pcs) | | — | — | — | — | — | — | — | — |
|  | Moldability in MAP method (pcs/1960 pcs) | | 1 | 0 | 7 | 0 | 0 | 0 | 0 | 0 |

TABLE 6

|  |  |  | Sample | | | | | | |
|---|---|---|---|---|---|---|---|---|---|
|  |  |  | 28 | 29 | 30 | 31 | 32 | 33 | 34 |
| Resin | Unsaturated | Unsaturated polyester A | 0 | 0 | 0 | 0 | 0 | 0 | 84 |
| component | polyester | Unsaturated polyester B | 94 | 0 | 0 | 0 | 0 | 0 | 0 |
| composition |  | Unsaturated polyester C | 0 | 94 | 0 | 0 | 0 | 0 | 0 |
|  |  | Unsaturated polyester D | 0 | 0 | 94 | 0 | 0 | 0 | 0 |
|  |  | Unsaturated polyester E | 0 | 0 | 0 | 94 | 0 | 0 | 0 |
|  |  | Unsaturated polyester F | 0 | 0 | 0 | 0 | 94 | 0 | 0 |
|  |  | Unsaturated polyester G | 0 | 0 | 0 | 0 | 0 | 94 | 0 |
|  |  | Unsaturated polyester H | 0 | 0 | 0 | 0 | 0 | 0 | 0 |
|  | Cross-linking | Diallyl phthalate monomer | 6 | 6 | 6 | 6 | 6 | 6 | 6 |
|  | agent | Triallyl isocyanurate | 0 | 0 | 0 | 0 | 0 | 0 | 0 |
|  |  | Diallyl phthalate prepolymer | 0 | 0 | 0 | 0 | 0 | 0 | 10 |
|  |  | Diethylene glycol dimethacrylate | 0 | 0 | 0 | 0 | 0 | 0 | 0 |
|  |  | Styrene | 0 | 0 | 0 | 0 | 0 | 0 | 0 |
|  | Curing accelerator | Dicumyl peroxide | 2 | 2 | 2 | 2 | 2 | 2 | 2 |
|  | Mold release agent | Zinc stearate | 1 | 1 | 1 | 1 | 1 | 1 | 1 |
|  | Antioxidant | HCA | 0.2 | 0.2 | 0.2 | 0.2 | 0.2 | 0.2 | 0.2 |
|  |  | AO-60 | 0.2 | 0.2 | 0.2 | 0.2 | 0.2 | 0.2 | 0.2 |
|  |  | AO-412S | 0 | 0 | 0 | 0 | 0 | 0 | 0 |
|  | Total of resin components | | 103.4 | 103.4 | 103.4 | 103.4 | 103.4 | 103.4 | 103.4 |
| Filler | White | Titanium oxide | 25 | 25 | 25 | 25 | 60 | 60 | 25 |
| composition | pigment | Zinc oxide | 0 | 0 | 0 | 0 | 0 | 0 | 0 |
|  | Inorganic | Silica | 65 | 65 | 65 | 65 | 25 | 25 | 25 |
|  | filler | Aluminum oxide | 0 | 0 | 0 | 0 | 0 | 0 | 0 |
|  |  | Hollow filler | 10 | 10 | 10 | 10 | 0 | 0 | 10 |
|  | Fibrous filler (glass fiber) | | 0 | 0 | 0 | 0 | 15 | 15 | 0 |
|  | Total of fillers | | 100 | 100 | 100 | 100 | 100 | 100 | 100 |

TABLE 6-continued

|  |  | Sample | | | | | | |
|---|---|---|---|---|---|---|---|---|
|  |  | 28 | 29 | 30 | 31 | 32 | 33 | 34 |
| Percentage of fillers in molding material (% by mass) | | 75 | 75 | 75 | 75 | 65 | 65 | 75 |
| Evaluation | Spiral flow length (cm) | 75 | 80 | 85 | 75 | 80 | 80 | 70 |
| | Curelastometer torque (N · m) | 3.9 | 3.9 | 3.9 | 3.9 | 3.9 | 3.9 | 3.9 |
| | Light reflectance Initial (%) | 94 | 93 | 92 | 91 | 91 | 91 | 90 |
| | After heat treatment (%) | 83 | 81 | 79 | 77 | 78 | 79 | 75 |
| | After UV irradiation and heat treatment (%) | 83 | 81 | 79 | 77 | 78 | 78 | 75 |
| | After high-temperature and high-humidity treatment (%) | 90 | 90 | 90 | 90 | 90 | 90 | 90 |
| | Odor during molding | OK | OK | OK | OK | OK | OK | OK |
| | Storage stability | A | A | A | A | A | A | A |
| | Individual moldability (pcs/2500 pcs) | — | — | — | — | — | — | — |
| | Moldability in MAP method (pcs/1960 pcs) | 0 | 0 | 0 | 0 | 0 | 0 | 0 |

TABLE 7

|  |  |  | Sample | | | | Comparison sample | | |
|---|---|---|---|---|---|---|---|---|---|
|  |  |  | 35 | 36 | 37 | 38 | 4 | 5 | 6 |
| Resin component composition | Unsaturated polyester | Unsaturated polyester A | 74 | 94 | 94 | 94 | 0 | 0 | 0 |
| | | Unsaturated polyester B | 0 | 0 | 0 | 0 | 0 | 0 | 0 |
| | | Unsaturated polyester C | 0 | 0 | 0 | 0 | 0 | 0 | 0 |
| | | Unsaturated polyester D | 0 | 0 | 0 | 0 | 0 | 0 | 0 |
| | | Unsaturated polyester E | 0 | 0 | 0 | 0 | 0 | 0 | 0 |
| | | Unsaturated polyester F | 0 | 0 | 0 | 0 | 0 | 0 | 0 |
| | | Unsaturated polyester G | 0 | 0 | 0 | 0 | 0 | 0 | 0 |
| | | Unsaturated polyester H | 0 | 0 | 0 | 0 | 90 | 94 | 94 |
| | Cross-linking agent | Diallyl phthalate monomer | 6 | 6 | 6 | 6 | 0 | 0 | 6 |
| | | Triallyl isocyanurate | 0 | 0 | 0 | 0 | 0 | 0 | 0 |
| | | Diallyl phthalate prepolymer | 20 | 0 | 0 | 0 | 0 | 0 | 0 |
| | | Diethylene glycol dimethacrylate | 0 | 0 | 0 | 0 | 3 | 3 | 0 |
| | | Styrene | 0 | 0 | 0 | 0 | 18 | 3 | 0 |
| | Curing accelerator | Dicumyl peroxide | 2 | 2 | 2 | 2 | 2 | 2 | 2 |
| | Mold release agent | Zinc stearate | 1 | 1 | 1 | 1 | 1 | 1 | 1 |
| | Antioxidant | HCA | 0.2 | 0.2 | 0.2 | 0.2 | 0.2 | 0.2 | 0.2 |
| | | AO-60 | 0.2 | 0.2 | 0.2 | 0.2 | 0.2 | 0.2 | 0.2 |
| | | AO-412S | 0 | 0 | 0.2 | 0.2 | 0 | 0 | 0 |
| | Total of resin components | | 103.4 | 103.4 | 103.4 | 103.2 | 114.4 | 103.4 | 103.4 |
| Filler composition | White pigment | Titanium oxide | 25 | 0 | 25 | 25 | 60 | 60 | 60 |
| | | Zinc oxide | 0 | 70 | 0 | 0 | 0 | 0 | 0 |
| | Inorganic filler | Silica | 65 | 20 | 65 | 65 | 25 | 25 | 25 |
| | | Aluminum oxide | 0 | 0 | 0 | 0 | 0 | 0 | 0 |
| | | Hollow filler | 10 | 10 | 10 | 10 | 10 | 10 | 10 |
| | Fibrous filler (glass fiber) | | 0 | 0 | 0 | 0 | 0 | 0 | 0 |
| | Total of fillers | | 100 | 100 | 100 | 100 | 95 | 95 | 95 |
| Percentage of fillers in molding material (% by mass) | | | 75 | 75 | 75 | 70 | 65 | 65 | 65 |
| Evaluation | Spiral flow length (cm) | | 70 | 85 | 70 | 85 | 3 | 3 | 3 |
| | Curelastometer torque (N · m) | | 3.9 | 3.9 | 3.9 | 3.4 | 2.5 | 2.0 | 2.5 |
| | Light reflectance | Initial (%) | 89 | 88 | 94 | 93 | 85 | 87 | 88 |
| | | After heat treatment (%) | 73 | 71 | 84 | 83 | 65 | 65 | 78 |
| | | After UV irradiation and heat treatment (%) | 73 | 71 | 84 | 83 | 68 | 65 | 71 |
| | | After high-temperature and high-humidity treatment (%) | 90 | 90 | 90 | 89 | 82 | 84 | 86 |
| | Odor during molding | | OK | OK | OK | OK | NG | NG | OK |
| | Storage stability | | A | A | A | A | B | B | B |
| | Individual moldability (pcs/2500 pcs) | | — | — | — | — | — | — | — |
| | Moldability in MAP method (pcs/1960 pcs) | | 0 | 0 | 1 | 0 | 22 | 35 | 16 |

The percentage of fillers in the molding material is changed in Samples 1 to 3 in Table 2 and Samples 20 to 22 in Table 5. In addition, composition of filler is changed in Samples 1 to 3 and Samples 20 to 22. In all cases, no significant difference is noticed with respect to the light reflectance and its change, the storage stability, and the moldability.

The percentage of titanium oxide, which is white pigment, is changed in Samples 1, 4, and 5 in Table 2. Also in these cases, however, no significant difference is noticed with respect to the light reflectance and its change, the storage stability, and the moldability.

The percentage of diallylphthalate monomer, which is a cross-linking agent, is changed in Samples 1, 6, and 7 in Table 2, and Samples 25 and 26 in Table 5. Also in these cases, no significant difference is noticed with respect to the light reflectance and its change, the storage stability, and the moldability. In Samples 8 and 27, triallylisocyanurate is used as the cross-linking agent, instead of diallylphthlate monomer in Sample 1. Also in these cases, no significant difference is noticed with respect to the light reflectance and its change, the storage stability, and the moldability. In Table 5, as described later, a ratio of the filler, particularly white pigment, is changed relative to Table 2.

In Samples 9 to 14 in Table 3, unsaturated polyesters B to G are used as the first unsaturated polyester, instead of unsaturated polyester A in Sample 1, respectively. Also in these cases, no significant difference is noticed with respect to the light reflectance and its change, the storage stability, and the moldability. On the other hand, in Comparison sample 1 in Table 4, unsaturated polyester H that is not the first unsaturated polyester is used, and also diethylene glycol dimethacrylate and styrene is used as the cross-linking agent. In this case, the light reflectance has degraded by heating and UV-ray irradiation, and problems related to the odor during molding, the storage stability, and the individual moldability also occur. Comparison sample 2 has different mixing ratio of the cross-linking agent to unsaturated polyester from Comparison sample 1, and the moldability is further degraded due to less amount of the cross-linking agent. In Comparison sample 3, diallylphthalate monomer is used as the cross-linking agent, as same as in Sample 1. In this case, the stability of the light reflectance and the moldability is slight improved, but are still apparently inferior to those in Samples 1 and 9 to 14.

In Sample 15 in Table 3 and Sample 16 in Table 4, diallylphthlate prepolymer alone is used or both diallylphthlate prepolymer and diallylphthlate monomer are used as the cross-linking agent, instead of diallylphthlate monomer in Sample 1. Also in this case, no significant difference is noticed with respect to the light reflectance and its change, the storage stability, and the moldability.

In Sample 17 in Table 4, zinc oxide is used as white pigment, instead of titanium oxide in Sample 1. Also in this case, no significant difference is noticed with respect to the light reflectance and its change, the storage stability, and the moldability.

Antioxidant AO-412S is added to compositions of Samples 17 and 1 in Samples 18 and 19 in Table 4, respectively. As a result, stability of the light reflectance has improved.

In Samples 20 to 23 in Table 5, the ratio of titanium oxide, which is white pigment, is smaller than those in Samples 1 to 3. Since the specific gravity of titanium oxide is relatively large, it is preferable to use less titanium oxide to reduce the weight of the lighting fixture. It is apparent that results of Sample 20 show the light reflectance equivalent to that of Sample 3 whose percentage of filler is same. Compositions of Samples 20, 23, and 24 are the same but there are slight differences in evaluation results. Accordingly, evaluation results are assumed to include variations to some extent.

In each of Samples 28 to 34 in Table 6, a ratio of the filler, particularly white pigment, is changed relative to Samples 9 to 15 in Table 3. In other words, the ratio of titanium oxide in each of Samples 28 to 34 is smaller than those of Samples 9 to 15, as same as in Samples 20 to 23 in Table 5. Also in these cases, Samples 28 to 34 show the equivalent light reflectance.

In Samples 35 to 38 and Comparison samples 4 to 6 in Table 7, composition of the filler is changed relative to Samples 16 to 19 and Comparison samples 1 to 3 in Table 4, and hollow filler is used. The moldability is evaluated based on MAP method. Comparison samples 4 to 6 are problematic also in this evaluation.

Second Exemplary Embodiment

The molding material for light-reflecting bodies (hereinafter referred to as "molding material") in this exemplary embodiment differs from the molding material in the first exemplary embodiment is that the unsaturated polyester contains second unsaturated polyester having fumaric acid residue, 1,4-butanediol residue, and trimethylolpropane residue. This structure achieves the same advantages as those in the first exemplary embodiment. Other points, including mixing ratios of cross-linking agent, filler, and other components, preference for crystalline second unsaturated polyester, and preferable ranges for glass transition temperature, melting point, iodine number and ICI viscosity at 150° C. of the second unsaturated polyester, are the same. Still more, a preparation method and molding method of the molding material, and application and fabrication method of light-reflecting body 1 of lighting fixture 6 shown in FIG. 1 to FIG. 3 are the same. Description of these points is omitted and only the difference is described below.

The second unsaturated polyester includes polybasic acid residue and polyol residue. A molar ratio of the polyol residue with respect to the polybasic acid residue in the second exemplary embodiment is, for example, in a range from 1.1 to 1.3. In other words, the second unsaturated polyester is synthesized, for example, by dehydration condensation reaction of polybasic acids and polyols at the molar ratio from 1:1.1 to 1:1.3.

In the exemplary embodiment, the polybasic acid residue contains a fumaric acid residue. This reduces remaining unreacted components when the molding material is heated and cured. Accordingly, the heat discoloration resistance of light-reflecting body 1 particularly improves.

The percentage of the fumaric acid residue with respect to the total polybasic acid residue in the second unsaturated polyester is preferably in a range from 40 mol % to 100 mol %, inclusive. In this case, the percentage of the fumaric acid residue not including aromatic ring is large in the second unsaturated polyester, and thus the heat discoloration resistance of light-reflecting body 1 particularly increases.

The polybasic acid residue in the second unsaturated polyester may only contain the fumaric acid residue or the fumaric acid residue and other residues. In particular, the polybasic acid residue preferably contains the fumaric acid residue and a terephthalic acid residue. In this case, compatibility of the second unsaturated polyester and cross-linking agent improves because the second unsaturated polyester includes aromatic ring, particularly when the cross-linking agent also includes aromatic ring. Accordingly, characteristics of light-reflecting body 1 also improve. The percentage of the terephthalic acid residue with respect to the total polybasic acid residue in the second unsaturated polyester is preferably not greater than 50 mol %.

The polybasic acid residue may further contain one or more unsaturated polybasic acid residues selected from the group consisting of a maleic acid residue, a citraconic acid residue, a mesaconic acid residue, an itaconic acid residue, a tetrahydrophthalic acid residue, a methyltetrahydrophthalic acid residue, and a glutaconic acid residue.

The polybasic acid residue may also contain one or more saturated polybasic acid residues selected from the group consisting of a phthalic acid residue, a 1,4-cyclohexanedicarboxylic acid residue, an isophthalic acid residue, a succinic acid residue, an adipic acid residue, a sebacic acid residue, an azelaic acid residue, an endo-methylene-tetrahydrophthalic acid residue, an HET acid residue, and a tetrabromophthalic acid residue. In this case, the heat discoloration resistance of light-reflecting body 1 particularly improves.

As described above, the polyol residue contains the 1,4-butanediol residue and the trimethylolpropane residue. A total percentage of the 1,4-butanediol residue and the trimethylolpropane residue with respect to the total polyol residue in the second unsaturated polyester is preferably not less than 80 mol %. This percentage may also be 100 mol %. As long as this percentage is not less than 80 mol %, crystallization of a cured product on curing the molding material is accelerated so as to achieve high dimensional stability of light-reflecting body 1.

The percentage of the 1,4-butanediol residue with respect to the total polyol residue in the second unsaturated polyester is preferably in a range from 70 mol % to 90 mol %, inclusive. In this case, crystallinity of the second unsaturated polyester improves, and the viscosity reduces. This improves the moldability of the molding material.

The percentage of the trimethylolpropane residue with respect to the total polyol residue in the second unsaturated polyester is preferably in a range from 10 mol % to 25 mol %, inclusive. In this case, compatibility of the second unsaturated polyester and the cross-linking agent in the molding material improves, and therefore characteristics of light-reflecting body 1, such as uniformity, improve. This is because the trimethylolpropane residue is assumed to reasonably reduce crystallinity of the second unsaturated polyester.

The percentage of the 1,2-propanediol residue with respect to the total polyol residue in the second unsaturated polyester is preferably in a range from 0 mol % to 10 mol %, inclusive. In this case, the resin strength of light-reflecting body 1 improves.

The polyol residue may still further contain residues other than the 1,4-butanediol residue, the 1,2-propanediol residue, and the trimethylolpropane residue. For example, the polyol residue can contain at least one residue selected from the group consisting of an ethylene glycol residue, a 1,3-propanediol residue, a 1,4-butanediol residue, a 1,3-butanediol residue, a 1,5-pentanediol residue, a propylene glycol residue, a diethylene glycol residue, a triethylene glycol residue, a dipropylene glycol residue, a hydrogenated bisphenol A residue, a bisphenol A propylene oxide compound residue, a dibromoneopentyl glycol residue, a 1,6-hexanediol residue, a neopentyl glycol residue, and a cyclohexane1,4-dimethanol residue.

The polyol residue also preferably includes one or more residues selected from the group consisting of an ethylene glycol residue, a 1,3-propanediol residue, a 1,4-butanediol residue, a 1,5-pentanediol residue, and a cyclohexanedimethanol residue. In this case, the heat discoloration resistance of light-reflecting body 1 particularly improves.

The acid number of the second unsaturated polyester is preferably in a range from 15 to 35 mg-KOH/g, and more preferably from 20 to 30 mg-KOH/g.

The second unsaturated polyester is synthesized by dehydration condensation reaction of, for example, raw material monomer including a polybasic acid and a polyol. In this case, the second unsaturated polyester includes a polybasic acid residue derived from the polybasic acid, and a polyol residue derived from the polyol. In this raw material monomer, the polybasic acid includes fumaric acid and terephthalic acid, and the polyol includes 1,4-butanediol, 1,2-propanediol, and trimethylolpropane.

Also in this exemplary embodiment, reactivity of the second unsaturated polyester under ordinary temperatures is low. Therefore, the molding material containing the second unsaturated polyester shows high storage stability.

Still more, in this exemplary embodiment, adhesion of a cured product of the molding material and metal is high because the molding material contains the second unsaturated polyester. Accordingly, when metal lead 2 is attached to light-reflecting body 1 fabricated from this molding material (see FIG. 1), adhesion between light-reflecting body 1 and lead 2 becomes high.

In particular, unsaturated polyester in the molding material more preferably contains only the second unsaturated polyester. Still more, unsaturated polyester may contain the second unsaturated polyester and a compound that has none of a fumaric acid residue, a terephthalic acid residue, a 1,4-butanediol residue, a 1,2-propanediol residue, and a trimethylolpropane residue. However, the percentage of the second unsaturated polyester with respect to the total unsaturated polyester is preferably not less than 40% by mass, and more preferably not less than 95% by mass.

Hereinafter, advantages of the present exemplary embodiment are shown with reference to specific examples.

[Preparation of Unsaturated Polyester]

The crystalline unsaturated polyesters are prepared, in the same way as that in the first exemplary embodiment, using the raw material monomer having compositions shown in Table 8. Table 8 also shows the iodine number, the melting point, and the ICI viscosity at 150° C. of each unsaturated polyester.

TABLE 8

| | | | J | K | L | M | N | P |
|---|---|---|---|---|---|---|---|---|
| Monomer composition (Mole ratio) | Polybasic acids | Fumaric acid | 65 | 55 | 95 | 65 | 65 | 65 |
| | | Terephthalic acid | 35 | 45 | 5 | 35 | 35 | 35 |
| | | Total | 100 | 100 | 100 | 100 | 100 | 100 |
| | Polyols | 1,4-butanediol | 85 | 85 | 85 | 80 | 80 | 100 |
| | | Trimethylolpropane | 15 | 15 | 15 | 20 | 15 | |
| | | 1,2-propanediol | | | | | 5 | |
| | | Total | 100 | 100 | 100 | 100 | 100 | 100 |
| Iodine number | | | 80 | 70 | 100 | 100 | 75 | 68 |
| Melting point (° C.) | | | 75 | 70 | 85 | 84 | 65 | 110 |
| ICI viscosity at 150° C. (Pa · s) | | | 3 | 2 | 2 | 4 | 5 | 8 |

[Preparation of Molding Material for Light-Reflecting Bodies]

Resin components and fillers with compositions shown in Table 9 to Table 12 are prepared, and the fillers are blended to achieve values indicated in "Percentage of filler in molding material" in the tables. Each amount of raw material indicated in a column of "Resin component composition" and a column of "Filler composition" is parts by mass. Granulated molding material is prepared below by the same operation as is the first exemplary embodiment.

Measurement results of a spiral flow length at 170° C. and torque by curelastometer of the molding material at 170° C. are also shown in the tables. The measuring method of these values are the same as in the first exemplary embodiment.

Details of raw materials shown in the tables, other than the unsaturated polyesters, are the same as those in the first exemplary embodiment.

[Evaluation]

The light reflectance, the odor during molding, the storage stability, the individual moldability, and the moldability in MAP method are evaluated, same as in the first exemplary embodiment. Tables 9 to 12 show these results.

TABLE 9

| | | | Sample | | | | | |
|---|---|---|---|---|---|---|---|---|
| | | | 39 | 40 | 41 | 42 | 43 | 44 |
| Resin component composition | Unsaturated polyester | Unsaturated polyester J | 91 | 94 | 85 | 91 | 94 | 85 |
| | | Unsaturated polyester K | 0 | 0 | 0 | 0 | 0 | 0 |
| | | Unsaturated polyester L | 0 | 0 | 0 | 0 | 0 | 0 |
| | | Unsaturated polyester M | 0 | 0 | 0 | 0 | 0 | 0 |
| | | Unsaturated polyester N | 0 | 0 | 0 | 0 | 0 | 0 |
| | | Unsaturated polyester P | 0 | 0 | 0 | 0 | 0 | 0 |
| | Cross-linking agent | Diallyl phthalate monomer | 6 | 3 | 12 | 0 | 0 | 0 |
| | | Triallyl isocyanurate | 0 | 0 | 0 | 6 | 3 | 12 |
| | Curing accelerator | Dicumyl peroxide | 2 | 2 | 2 | 2 | 2 | 2 |
| | Mold release agent | Zinc stearate | 1 | 1 | 1 | 1 | 1 | 1 |
| | Antioxidant | HCA | 0.2 | 0.2 | 0.2 | 0.2 | 0.2 | 0.2 |
| | | AO-60 | 0 | 0 | 0.2 | 0 | 0 | 0 |
| | | AO-412S | 0 | 0 | 0.2 | 0 | 0 | 0 |
| | Total of resin components | | 100.2 | 100.4 | 100.6 | 100.2 | 100.2 | 100.2 |
| Filler composition | White pigment | Titanium oxide | 55 | 55 | 55 | 55 | 55 | 55 |
| | Inorganic filler | Silica | 30 | 30 | 30 | 30 | 30 | 30 |
| | | Hollow filler | 0 | 0 | 0 | 0 | 0 | 0 |
| | Fibrous filler | Glass fiber | 15 | 15 | 15 | 15 | 15 | 15 |
| | Total of fillers | | 100 | 100 | 100 | 100 | 100 | 100 |
| Percentage of fillers in molding material (% by mass) | | | 65 | 55 | 75 | 65 | 65 | 65 |
| Evaluation | Spiral flow length (cm) | | 63 | 55 | 78 | 61 | 51 | 75 |
| | Curelastometer torque (N · m) | | 3 | 3 | 4 | 3 | 4 | 3 |
| | Light reflectance | Initial (%) | 94 | 95 | 95 | 94 | 95 | 95 |
| | | After heat treatment (%) | 83 | 85 | 87 | 85 | 84 | 85 |
| | | After UV irradiation and heat treatment (%) | 83 | 85 | 86 | 85 | 84 | 85 |
| | | After high-temperature and high-humidity treatment (%) | 90 | 90 | 91 | 90 | 90 | 90 |
| | Odor during molding | | OK | OK | OK | OK | OK | OK |
| | Storage stability | | A | A | A | A | A | A |
| | Individual moldability (Pcs/2500 pcs) | | 10 | 5 | 2 | 5 | 9 | 4 |
| | Moldability in MAP method (pcs/1960 pcs) | | — | — | — | — | — | — |

TABLE 10

| | | | Sample | | | | Comparison sample |
|---|---|---|---|---|---|---|---|
| | | | 45 | 46 | 47 | 48 | 7 |
| Resin component composition | Unsaturated polyester | Unsaturated polyester J | 0 | 0 | 0 | 0 | 0 |
| | | Unsaturated polyester K | 91 | 0 | 0 | 0 | 0 |
| | | Unsaturated polyester L | 0 | 91 | 0 | 0 | 0 |
| | | Unsaturated polyester M | 0 | 0 | 91 | 0 | 0 |
| | | Unsaturated polyester N | 0 | 0 | 0 | 91 | 0 |
| | | Unsaturated polyester P | 0 | 0 | 0 | 0 | 91 |
| | Cross-linking agent | Diallyl phthalate monomer | 6 | 6 | 6 | 6 | 6 |
| | | Triallyl isocyanurate | 0 | 0 | 0 | 0 | 0 |
| | Curing accelerator | Dicumyl peroxide | 2 | 2 | 2 | 2 | 2 |

TABLE 10-continued

|  |  |  | Sample | | | | Comparison sample |
|---|---|---|---|---|---|---|---|
|  |  |  | 45 | 46 | 47 | 48 | 7 |
|  | Mold release agent | Zinc stearate | 1 | 1 | 1 | 1 | 1 |
|  | Antioxidant | HCA | 0.2 | 0.2 | 0.2 | 0.2 | 0.2 |
|  |  | AO-60 | 0 | 0 | 0 | 0 | 0 |
|  |  | AO-412S | 0 | 0 | 0.2 | 0 | 0 |
|  | Total of resin components | | 100.2 | 100.2 | 100.2 | 100.2 | 100.2 |
| Filler composition | White pigment | Titanium oxide | 55 | 55 | 55 | 55 | 55 |
|  | Inorganic filler | Silica | 30 | 30 | 30 | 30 | 30 |
|  |  | Hollow filler | 0 | 0 | 0 | 0 | 0 |
|  | Fibrous filler | Glass fiber | 15 | 15 | 15 | 15 | 15 |
|  | Total of fillers | | 100 | 100 | 100 | 100 | 100 |
| Percentage of fillers in molding material (% by mass) | | | 65 | 65 | 65 | 65 | 65 |
| Evaluation | Spiral flow length (cm) | | 66 | 66 | 63 | 63 | 45 |
|  | Curelastometer torque (N · m) | | 4 | 3 | 3 | 2.5 | 3 |
|  | Light reflectance | Initial (%) | 94 | 94 | 94 | 94 | 94 |
|  |  | After heat treatment (%) | 83 | 83 | 83 | 83 | 83 |
|  |  | After UV irradiation and heat treatment (%) | 83 | 83 | 83 | 83 | 75 |
|  |  | After high-temperature and high-humidity treatment (%) | 90 | 90 | 90 | 90 | 83 |
|  | Odor during molding | | OK | OK | OK | OK | OK |
|  | Storage stability | | A | A | A | A | B |
|  | Individual moldability (Pcs/2500 pcs) | | 3 | 7 | 15 | 15 | 45 |
|  | Moldability in MAP method (pcs/1960 pcs) | | — | — | — | — | — |

TABLE 11

|  |  |  | Sample | | | | | |
|---|---|---|---|---|---|---|---|---|
|  |  |  | 49 | 50 | 51 | 52 | 53 | 54 |
| Resin component composition | Unsaturated polyester | Unsaturated polyester J | 91 | 94 | 85 | 91 | 94 | 85 |
|  |  | Unsaturated polyester K | 0 | 0 | 0 | 0 | 0 | 0 |
|  |  | Unsaturated polyester L | 0 | 0 | 0 | 0 | 0 | 0 |
|  |  | Unsaturated polyester M | 0 | 0 | 0 | 0 | 0 | 0 |
|  |  | Unsaturated polyester N | 0 | 0 | 0 | 0 | 0 | 0 |
|  |  | Unsaturated polyester P | 0 | 0 | 0 | 0 | 0 | 0 |
|  | Cross-linking agent | Diallyl phthalate monomer | 6 | 3 | 12 | 0 | 0 | 0 |
|  |  | Triallyl isocyanurate | 0 | 0 | 0 | 6 | 3 | 12 |
|  | Curing accelerator | Dicumyl peroxide | 2 | 2 | 2 | 2 | 2 | 2 |
|  | Mold release agent | Zinc stearate | 1 | 1 | 1 | 1 | 1 | 1 |
|  | Antioxidant | HCA | 0.2 | 0.2 | 0.2 | 0.2 | 0.2 | 0.2 |
|  |  | AO-60 | 0 | 0 | 0.2 | 0 | 0 | 0 |
|  |  | AO-412S | 0 | 0 | 0 | 0 | 0 | 0 |
|  | Total of resin components | | 100.2 | 100.2 | 100.6 | 100.2 | 100.2 | 100.2 |
| Filler composition | White pigment | Titanium oxide | 25 | 25 | 25 | 25 | 25 | 25 |
|  | Inorganic filler | Silica | 65 | 65 | 65 | 65 | 65 | 65 |
|  |  | Hollow filler | 10 | 10 | 10 | 10 | 10 | 10 |
|  | Fibrous filler | Glass fiber | 0 | 0 | 0 | 0 | 0 | 0 |
|  | Total of fillers | | 100 | 100 | 100 | 100 | 100 | 100 |
| Percentage of fillers in molding material (% by mass) | | | 75 | 70 | 80 | 75 | 75 | 75 |
| Evaluation | Spiral flow length (cm) | | 70 | 85 | 45 | 65 | 78 | 56 |
|  | Curelastometer torque (N · m) | | 3.9 | 3.4 | 4.9 | 3.9 | 3.9 | 3.9 |
|  | Light reflectance | Initial (%) | 94 | 95 | 95 | 94 | 95 | 95 |
|  |  | After heat treatment (%) | 83 | 85 | 86 | 85 | 84 | 85 |
|  |  | After UV irradiation and heat treatment (%) | 83 | 85 | 86 | 85 | 84 | 85 |
|  |  | After high-temperature and high-humidity treatment (%) | 90 | 90 | 90 | 90 | 90 | 90 |

TABLE 11-continued

|  |  | Sample | | | | | |
|---|---|---|---|---|---|---|---|
|  |  | 49 | 50 | 51 | 52 | 53 | 54 |
| Odor during molding | | OK | OK | OK | OK | OK | OK |
| Storage stability | | A | A | A | A | A | A |
| Individual moldability (Pcs/2500 pcs) | | — | — | — | — | — | — |
| Moldability in MAP method (pcs/1960 pcs) | | 2 | 1 | 15 | 1 | 7 | 3 |

TABLE 12

|  |  |  | Sample | | | | Comparison sample |
|---|---|---|---|---|---|---|---|
|  |  |  | 55 | 56 | 57 | 58 | 8 |
| Resin component composition | Unsaturated polyester | Unsaturated polyester J | 0 | 0 | 0 | 0 | 0 |
| | | Unsaturated polyester K | 91 | 0 | 0 | 0 | 0 |
| | | Unsaturated polyester L | 0 | 91 | 0 | 0 | 0 |
| | | Unsaturated polyester M | 0 | 0 | 91 | 0 | 0 |
| | | Unsaturated polyester N | 0 | 0 | 0 | 91 | 0 |
| | | Unsaturated polyester P | 0 | 0 | 0 | 0 | 91 |
| | Cross-linking agent | Diallyl phthalate monomer | 6 | 6 | 6 | 6 | 6 |
| | | Triallyl isocyanurate | 0 | 0 | 0 | 0 | 0 |
| | Curing accelerator | Dicumyl peroxide | 2 | 2 | 2 | 2 | 2 |
| | Mold release agent | Zinc stearate | 1 | 1 | 1 | 1 | 1 |
| | Antioxidant | HCA | 0.2 | 0.2 | 0.2 | 0.2 | 0.2 |
| | | AO-60 | 0 | 0 | 0 | 0 | 0 |
| | | AO-412S | 0 | 0 | 0 | 0 | 0 |
| | Total of resin components | | 100.2 | 100.2 | 100.2 | 100.2 | 100.2 |
| Filler composition | White pigment | Titanium oxide | 25 | 25 | 25 | 25 | 25 |
| | Inorganic filler | Silica | 65 | 65 | 65 | 65 | 65 |
| | | Hollow filler | 10 | 10 | 10 | 10 | 10 |
| | Fibrous filler | Glass fiber | 0 | 0 | 0 | 0 | 0 |
| | Total of fillers | | 100 | 100 | 100 | 100 | 100 |
| Percentage of fillers in molding material (% by mass) | | | 75 | 75 | 75 | 75 | 75 |
| Evaluation | Spiral flow length (cm) | | 100 | 75 | 75 | 80 | 45 |
| | Curelastometer torque (N · m) | | 3.9 | 3.9 | 3.9 | 3.9 | 3.9 |
| | Light reflectance | Initial (%) | 94 | 94 | 94 | 94 | 94 |
| | | After heat treatment (%) | 83 | 83 | 83 | 83 | 83 |
| | | After UV irradiation and heat treatment (%) | 83 | 83 | 83 | 83 | 75 |
| | | After high-temperature and high-humidity treatment (%) | 90 | 90 | 90 | 90 | 86 |
| | Odor during molding | | OK | OK | OK | OK | OK |
| | Storage stability | | A | A | A | A | B |
| | Individual moldability (Pcs/2500 pcs) | | — | — | — | — | — |
| | Moldability in MAP method (pcs/1960 pcs) | | 3 | 4 | 5 | 5 | 25 |

In each of Samples 39 to 41 in Table 9 and Samples 49 to 51 in Table 11, diallylphthlate monomer is used as the cross-linking agent, and the percentages are different from each other. In each of Samples 42 to 44 and Samples 52 to 54, triallylisocyanurate is used as the cross-linking agent, and the percentages are different from each other. In all cases, no significant difference is noticed with respect to the light reflectance and its change, the storage stability, and the moldability.

In each of Samples 49 to 54 in Table 11, a ratio of titanium oxide, which is white pigment, is smaller than those in Samples 39 to 44 in Table 9. Also in these cases, it is apparent that the equivalent light reflectance is achieved.

In each of Samples 45 to 48 in Table 10, unsaturated polyesters K to N is used as the second unsaturated polyester, respectively, instead of unsaturated polyester J in Sample 39. Also in these cases, no significant difference is noticed with respect to the light reflectance and its change, the storage stability, and the moldability. On the other hand, in Comparison sample 7 in Table 10, unsaturated polyester P that is not the second unsaturated polyester is used. In this case, the light reflectance is degraded by UV-ray irradiation or high-temperature and high-humidity treatment, and problems in the storage stability and the individual moldability also occur.

In each of Samples 55 to 58 and Comparison sample 8 in Table 12, a ratio of the filler, particularly white pigment, is changed relative to Samples 45 to 48 and Comparison sample 7 in Table 10. In other words, a ratio of titanium oxide in Samples 55 to 58 is smaller than those in Samples 45 to 48, as same as that in Samples 49 to 54. Also in these cases, the equivalent light reflectance is achieved. The moldability in MAP method is evaluated, and Comparison sample 8 is also problematic in this evaluation.

The first exemplary embodiment refers to the case that unsaturated polyester contains the first unsaturated polyester having the fumaric acid residue and the 1,6-hexanediol residue, and the second exemplary embodiment refers to unsaturated polyester containing the second unsaturated polyester having the fumaric acid residue, the 1,4-butanediol residue, and the trimethylolpropane residue. However, the first unsaturated polyester and the second unsaturated polyester may be used concurrently. In this case, a total percentage of the first unsaturated polyester and the second unsaturated polyester in total unsaturated polyester is preferably not less than 40% by mass, and more preferably not less than 95% by mass.

INDUSTRIAL APPLICABILITY

The molding material for light-reflecting bodies in the present invention show good fluidity, and can be used for fabricating light-reflecting bodies with high heat discoloration resistance. Accordingly, this molding material is effectively applicable to manufacturing light-reflecting bodies typically for lighting.

REFERENCE MARKS IN THE DRAWINGS

1 Light-reflecting body
2 Lead
3 Light-emitting element
5 Member
6 Lighting fixture
10 Molded body
11 Intervening member
12 Main body
13 Recessed part
14 Inner peripheral face
20 Lead frame
21 First lead
22 Second lead
41 First wire
42 Second wire

The invention claimed is:

1. A molding material for light-reflecting bodies, comprising
unsaturated polyester;
a cross-linking agent; and
a filler,
wherein the unsaturated polyester includes at least one of first unsaturated polyester having a fumaric acid residue, a 1,6-hexanediol residue, and a trimethylolpropane residue, and second unsaturated polyester having a fumaric acid residue, a 1,4-butanediol residue, and a trimethylolpropane residue.

2. The molding material for light-reflecting bodies according to claim 1,
wherein the unsaturated polyester includes the first unsaturated polyester, and
a percentage of the 1,6-hexanediol residue with respect to total polyol residues in the first unsaturated polyester is in a range from 80 mol % to 100 mol %, inclusive.

3. The molding material for light-reflecting bodies according to claim 1,
wherein a percentage of the trimethylolpropane residue with respect to total polyol residues in the first unsaturated polyester is more than 0 mol % and at most 15 mol %.

4. The molding material for light-reflecting bodies according to claim 1,
wherein the unsaturated polyester includes the first unsaturated polyester, and
the first unsaturated polyester has crystallinity.

5. The molding material for light-reflecting bodies according to claim 1,
wherein the unsaturated polyester includes the first unsaturated polyester, and
a glass transition temperature of the first unsaturated polyester is in a range from 30° C. to 50° C., inclusive.

6. The molding material for light-reflecting bodies according to claim 1,
wherein the unsaturated polyester includes the first unsaturated polyester, and
a melting point of the first unsaturated polyester is in a range from 70° C. to 100° C., inclusive.

7. The molding material for light-reflecting bodies according to claim 1,
wherein the unsaturated polyester includes the first unsaturated polyester, and
an iodine number of the first unsaturated polyester is in a range from 70 to 135, inclusive.

8. The molding material for light-reflecting bodies according to claim 1,
wherein the unsaturated polyester includes the first unsaturated polyester, and
ICI viscosity of the first unsaturated polyester at 150° C. is in a range from 0.1 Pa·s to 5 Pa·s, inclusive.

9. The molding material for light-reflecting bodies according to claim 1,
wherein the unsaturated polyester includes the second unsaturated polyester, and
a percentage with respect to total polyol residues in the second unsaturated polyester of:
the 1,4-butanediol residue is in a range from 70 mol % to 90 mol %, inclusive, and
the trimethylolpropane residue is in a range from 10 mol % to 25 mol %, inclusive.

10. The molding material for light-reflecting bodies according to claim 1,
wherein the unsaturated polyester includes the second unsaturated polyester, and
the second unsaturated polyester further has a 1,2-propanediol residue.

11. The molding material for light-reflecting bodies according to claim 10,
wherein a percentage of the 1,2-propanediol residue with respect to total polyol residues in the second unsaturated polyester is 10 mol % or smaller.

12. The molding material for light-reflecting bodies according to claim 1,
wherein the unsaturated polyester includes the second unsaturated polyester, and
the second unsaturated polyester further has a terephthalic acid residue.

13. The molding material for light-reflecting bodies according to claim 1,
wherein the unsaturated polyester includes the second unsaturated polyester, and
the second unsaturated polyester has crystallinity.

14. The molding material for light-reflecting bodies according to claim 1,
wherein the unsaturated polyester includes the second unsaturated polyester, and
a glass transition temperature of the second unsaturated polyester is in a range from 30° C. to 50° C., inclusive.

15. The molding material for light-reflecting bodies according to claim 1, wherein the unsaturated polyester includes the second unsaturated polyester, and a melting point of the second unsaturated polyester is in a range from 70° C. to 100° C., inclusive.

16. The molding material for light-reflecting bodies according to claim 1, wherein the unsaturated polyester includes the second unsaturated polyester, and an iodine number of the second unsaturated polyester is in a range from 70 to 135, inclusive.

17. The molding material for light-reflecting bodies according to claim 1, wherein the unsaturated polyester includes the second unsaturated polyester, and ICI viscosity of the second unsaturated polyester at 150° C. is in a range from 0.1 Pa·s to 5 Pa·s, inclusive.

\* \* \* \* \*